United States Patent
Choi et al.

(10) Patent No.: US 12,133,393 B2
(45) Date of Patent: Oct. 29, 2024

(54) METHOD OF MANUFACTURING SEMICONDUCTOR DEVICE

(71) Applicant: SAMSUNG ELECTRONICS CO., LTD., Suwon-si (KR)

(72) Inventors: Do Young Choi, Hwaseong-si (KR); Kab Jin Nam, Seoul (KR); In Bong Pok, Hwaseong-si (KR); Dae Won Ha, Seoul (KR); Musarrat Hasan, Sejong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 386 days.

(21) Appl. No.: 17/502,380

(22) Filed: Oct. 15, 2021

(65) Prior Publication Data
US 2022/0310654 A1   Sep. 29, 2022

(30) Foreign Application Priority Data
Mar. 24, 2021 (KR) .................. 10-2021-0037773

(51) Int. Cl.
*H01L 27/11592* (2017.01)
*H01L 21/02* (2006.01)
(Continued)

(52) U.S. Cl.
CPC ......... *H10B 51/40* (2023.02); *H01L 21/0259* (2013.01); *H01L 29/0665* (2013.01);
(Continued)

(58) Field of Classification Search
CPC .......... H01L 21/0259; H01L 21/02603; H01L 21/28185; H01L 21/823431; H01L 21/823821; H01L 21/845; H01L 27/0886; H01L 27/0924; H01L 27/1211; H01L 29/0665; H01L 29/0669; H01L 29/0673; H01L 29/40111; H01L 29/41791; H01L 29/42392; H01L 29/516; H01L 29/517; H01L 29/66439; H01L 29/66545; H01L 29/66742; H01L 29/66795; H01L 29/6684;
(Continued)

(56) References Cited

U.S. PATENT DOCUMENTS 8,304,823 B2   11/2012   Boescke
9,053,802 B2    6/2015   Müller et al.
(Continued)

FOREIGN PATENT DOCUMENTS

KR   2003-0071586 A   9/2003

*Primary Examiner* — David C Spalla
(74) *Attorney, Agent, or Firm* — Muir Patent Law, PLLC

(57) ABSTRACT

A method of manufacturing a semiconductor device, the method including providing a substrate including a first region and a second region such that the second region is separated from the first region; forming a metal oxide film on the first region of the substrate and the second region of the substrate; forming an upper metal material film on the metal oxide film on the first region of the substrate such that the upper metal material film does not overlap the metal oxide film on the second region of the substrate; and simultaneously annealing the upper metal material film and the metal oxide film to form a ferroelectric insulating film on the first region of the substrate and form a paraelectric insulating film on the second region of the substrate.

20 Claims, 49 Drawing Sheets

(51) Int. Cl.
*H01L 21/28* (2006.01)
*H01L 27/1159* (2017.01)
*H01L 29/06* (2006.01)
*H01L 29/423* (2006.01)
*H01L 29/51* (2006.01)
*H01L 29/66* (2006.01)
*H01L 29/78* (2006.01)
*H01L 29/786* (2006.01)
*H10B 51/30* (2023.01)
*H10B 51/40* (2023.01)

(52) U.S. Cl.
CPC .. *H01L 29/40111* (2019.08); *H01L 29/42392* (2013.01); *H01L 29/516* (2013.01); *H01L 29/66545* (2013.01); *H01L 29/66742* (2013.01); *H01L 29/66795* (2013.01); *H01L 29/6684* (2013.01); *H01L 29/78391* (2014.09); *H01L 29/7851* (2013.01); *H01L 29/78696* (2013.01); *H10B 51/30* (2023.02)

(58) Field of Classification Search
CPC ............. H01L 29/775; H01L 29/78391; H01L 29/785; H01L 29/7851; H01L 29/7853; H01L 29/7855; H01L 29/78696; H01L 2029/7858; H10B 51/30; H10B 51/40
See application file for complete search history.

(56) References Cited

U.S. PATENT DOCUMENTS

| | | | |
|---|---|---|---|
| 9,349,842 | B2 | 5/2016 | Schloesser et al. |
| 10,249,756 | B2 | 4/2019 | Tu et al. |
| 10,600,808 | B2* | 3/2020 | Schröder ................ H01L 28/40 |
| 10,686,039 | B2* | 6/2020 | Frank .................... H01L 27/088 |
| 2017/0005261 | A1* | 1/2017 | Fujii ...................... H10N 70/00 |
| 2018/0166453 | A1 | 6/2018 | Müller |
| 2019/0296122 | A1* | 9/2019 | Ino .................... H01L 29/78391 |

* cited by examiner

METHOD OF MANUFACTURING SEMICONDUCTOR DEVICE

CROSS-REFERENCE TO RELATED APPLICATION

This application claims priority from Korean Patent Application No. 10-2021-0037773 filed on Mar. 24, 2021 in the Korean Intellectual Property Office, the disclosure of which is incorporated herein by reference in its entirety.

BACKGROUND

1. Field

Embodiments relate to a method of manufacturing a semiconductor device.

2. Description of the Related Art

In some computing system structures, commands (or programs) and data may be stored in a memory device separated from a processor, and in order to perform data processing of the data on the basis of the commands, the commands and the data may need to be transmitted.

SUMMARY

The embodiments may be realized by providing a method of manufacturing a semiconductor device, the method including providing a substrate including a first region and a second region such that the second region is separated from the first region; forming a metal oxide film on the first region of the substrate and the second region of the substrate; forming an upper metal material film on the metal oxide film on the first region of the substrate such that the upper metal material film does not overlap the metal oxide film on the second region of the substrate; and simultaneously annealing the upper metal material film and the metal oxide film to form a ferroelectric insulating film on the first region of the substrate and form a paraelectric insulating film on the second region of the substrate.

The embodiments may be realized by providing a method of manufacturing a semiconductor device, the method including forming a first dummy gate on a substrate such that the first dummy gate includes first spacers extending in a first direction and a first dummy electrode between the first spacers; forming a second dummy gate on the substrate such that the second dummy gate includes second spacers extending in the first direction and different from the first spacers and a second dummy electrode between the second spacers; removing the first dummy electrode and the second dummy electrode to form a first trench between the first spacers and a second trench between the second spacers; forming a metal oxide film along an upper surface of the substrate and at least a part of side walls of the first spacers and the second spacers; forming an upper metal material on the metal oxide film such that the upper metal material does not overlap the second spacers and the second trench in a vertical direction; and simultaneously annealing the upper metal material and the metal oxide film to form a ferroelectric insulating film along at least a part of the side wall of the first spacers, and to form a paraelectric insulating film along at least a part of the side wall of the second spacers.

The embodiments may be realized by providing a method of manufacturing a semiconductor device, the method including providing a substrate; forming a gate electrode on the substrate; forming an interlayer insulating film that covers the gate electrode on the substrate; forming a first lower metal film and a second lower metal film on the interlayer insulating film such that the second lower metal film is separated from the first lower metal film; forming a metal oxide film on the first lower metal film, the second lower metal film, and the interlayer insulating film; forming an upper metal material film on the metal oxide film such that the upper metal material film does not overlap a portion of the metal oxide film on the second lower metal film; and simultaneously annealing the upper metal material film and the metal oxide film to form a ferroelectric insulating film overlapping the first lower metal film in a vertical direction, and to form a paraelectric insulating film overlapping the second lower metal film in the vertical direction.

BRIEF DESCRIPTION OF THE DRAWINGS

Features will be apparent to those of skill in the art by describing in detail exemplary embodiments with reference to the attached drawings in which.

DETAILED DESCRIPTION

In an implementation, a semiconductor device may be, e.g., a fin transistor (FinFET) including a channel region of a fin pattern shape, a planar transistor, a transistor including a nanowire or a nanosheet, and a MBCFET™ (Multi-Bridge Channel Field Effect Transistor), or another structure. The semiconductor device according to some embodiments may, e.g., include a tunneling transistor (tunneling FET) or a three-dimensional (3D) transistor. In addition, the embodiments may be applied to transistors based on two-dimensional materials (2D material based FETs) and a heterostructure thereof.

In an implementation, the semiconductor device according to some embodiments may also include a bipolar junction transistor, a laterally diffused metal oxide semiconductor (LDMOS), or the like.

Figure 1:
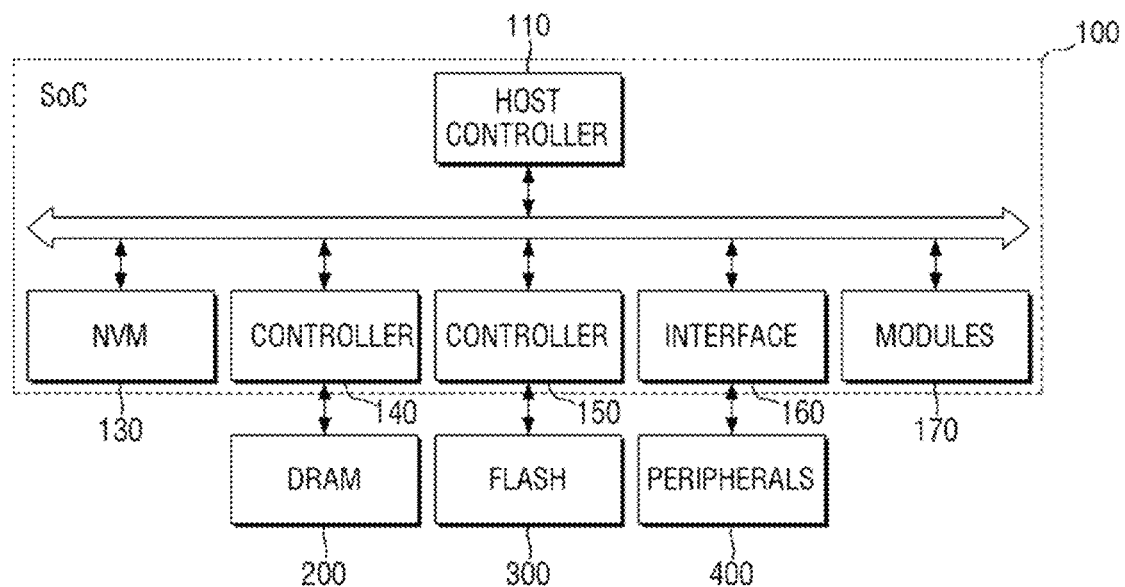
FIG. 1 is a diagram of an electronic system including a semiconductor device according to some embodiments.

FIG. 1 is a diagram of an electronic system 100 including a semiconductor device according to some embodiments.

The electronic system 100 according to some embodiments may be implemented as a system-on-chip (SoC), which is a single chip form.

The electronic system 100 may include a host processor 110, a memory 130, a first external memory controller 140, a second external memory controller 150, an interface 160, and a module 170. The host processor 110, the memory 130, the first external memory controller 140, the second external memory controller 150, the interface 160 and the module 170 may be connected to each other through a bus 120.

The bus 120 may provide a data input/output path, a command path, and the like. A redistribution structure 180 (see FIG. 31) to be described below may be included.

The host processor 110 may be connected to the bus 120 to control the operation of the electronic system 100 and process the data to be input. The host processor 110 may communicate with an external device through the interface 160 to receive and process data and transmit the processed data. The host processor 110 may be implemented as neuromorphic computing, a graphic processing unit and a CPU (Central Processing Units), or the like. As used herein, the term "or" is not an exclusive term, e.g., "A or B" would include A, B, or A and B.

The memory 130 may store data necessary for the operation of the host processor 110.

The memory 130 may include, e.g., a non-volatile memory (NVM). The non-volatile memory may include a memory element, and the memory element of the non-volatile memory according to some embodiments may include at least one ferroelectric transistor. The ferroelectric transistor may have, e.g., a planar FET, a finFET, a gate-all-around transistor, or other structures.

The non-volatile memory (NVM) according to some embodiments may be on the same die as the host processor 110.

The electronic system 100 may be connected to a first external memory 200 and a second external memory 300 outside due to the storage capacity and the limited area of the electronic system 100.

The first external controller 140 and the second external controller 150 may provide the data processed by the host processor 110 to the first external memory 200 or the second external memory 300. The first external controller 140 and the second external controller 150 may provide the data stored in the first external memory 200 or the second external memory 300 to the electronic system 100.

The electronic system 100 may include a plurality of modules 270 for driving the electronic system 100. The plurality of modules 270 may include a computing device or the like that performs a processing operation by a command provided from the host processor 110. The computing device may include a CPU (Central Processor Unit), an MPU (Micro Processor Unit), a GPU (Graphic Processor Unit), a controller, an application specific integrated circuit (ASIC), a modem chip, or the like.

The electronic device 400 may be connected to the electronic system 100 through an interface 160. The electronic device 400 may include, e.g., a display that communicates with the electronic system 100, an image sensor and the like.

The electronic system according to some embodiments may be included, e.g., in a server, a computer, a smartphone, a tablet, a PDA (personal digital assistant), a digital camera, a PMP (portable multimedia player), a wearable device, an internet of things (IoT) device, or the like.

Figure 2:
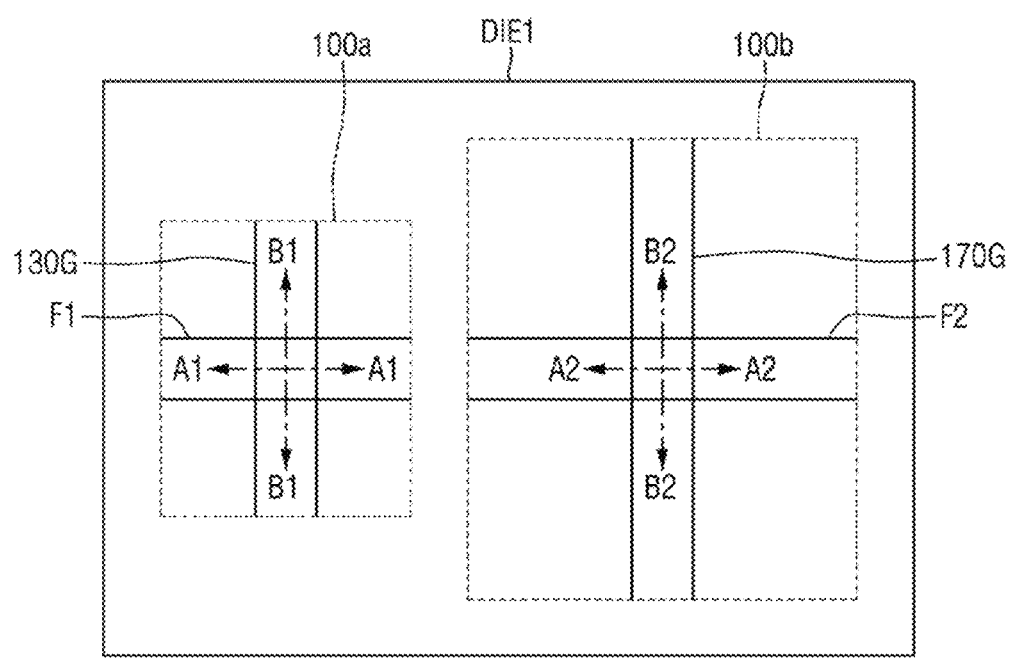
FIG. 2 is a partial view of the semiconductor device according to some embodiments.
Figure 3:
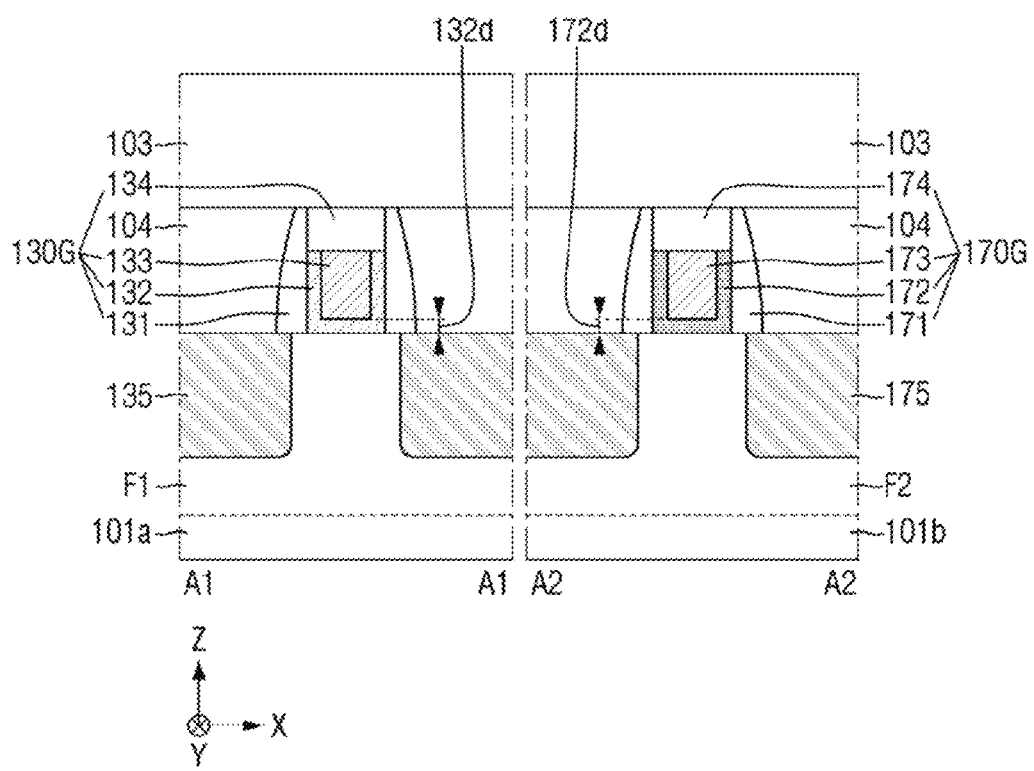
FIG. 3 is a cross-sectional view taken along A1-A1 and A2-A2 of FIG. 2.
Figure 4:
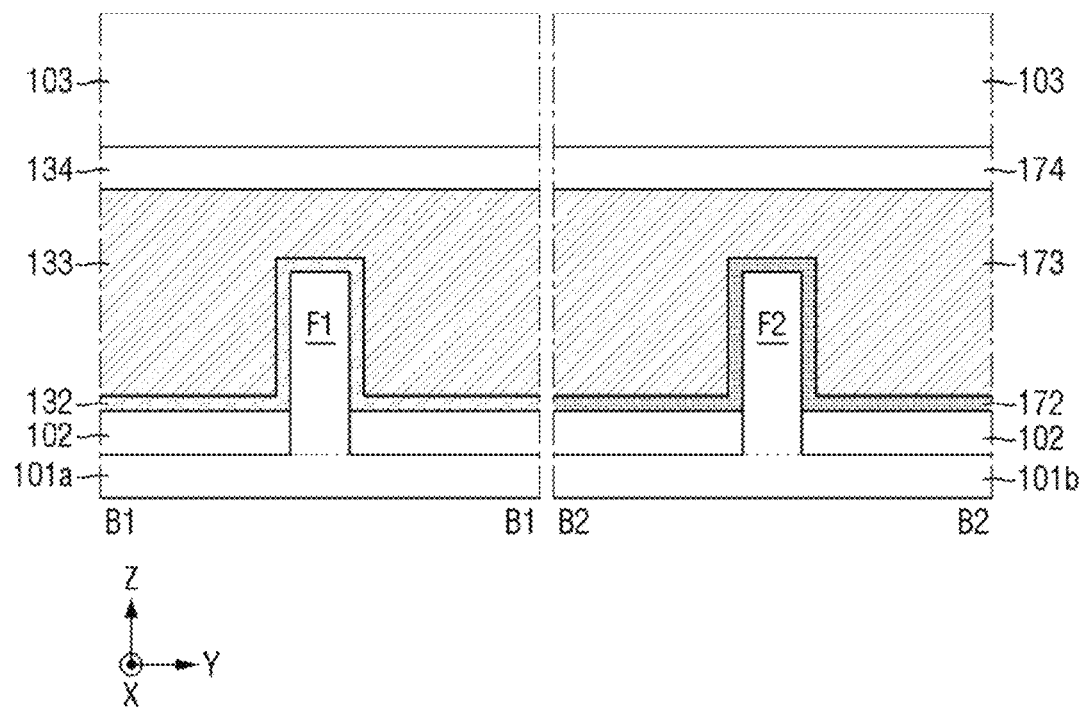
FIG. 4 is a cross-sectional view taken along B1-B1 and B2-B2 of FIG. 2.
Figure 5:
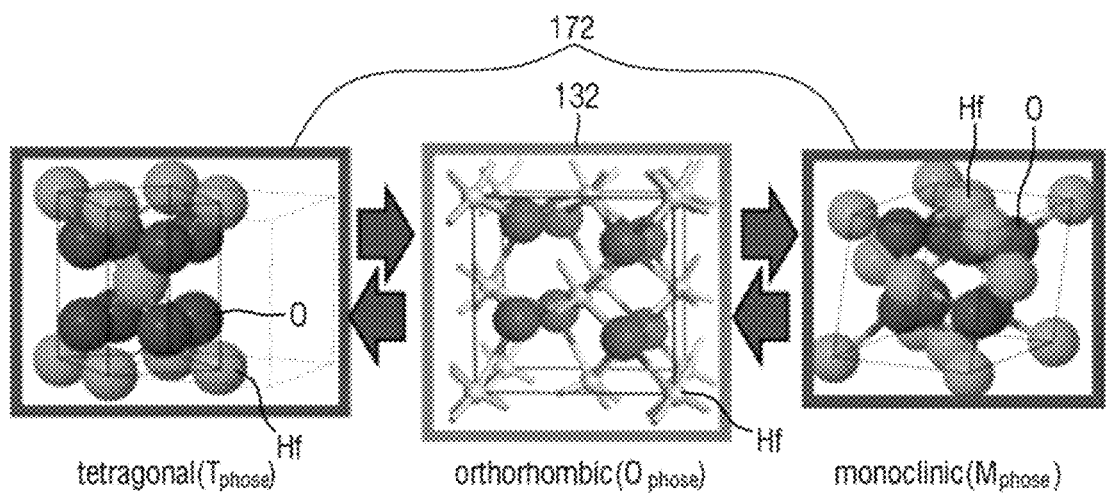
FIG. 5 is a diagram showing a crystal structure of a ferroelectric insulating film and a paraelectric insulating film according to some embodiments.
Figure 6:
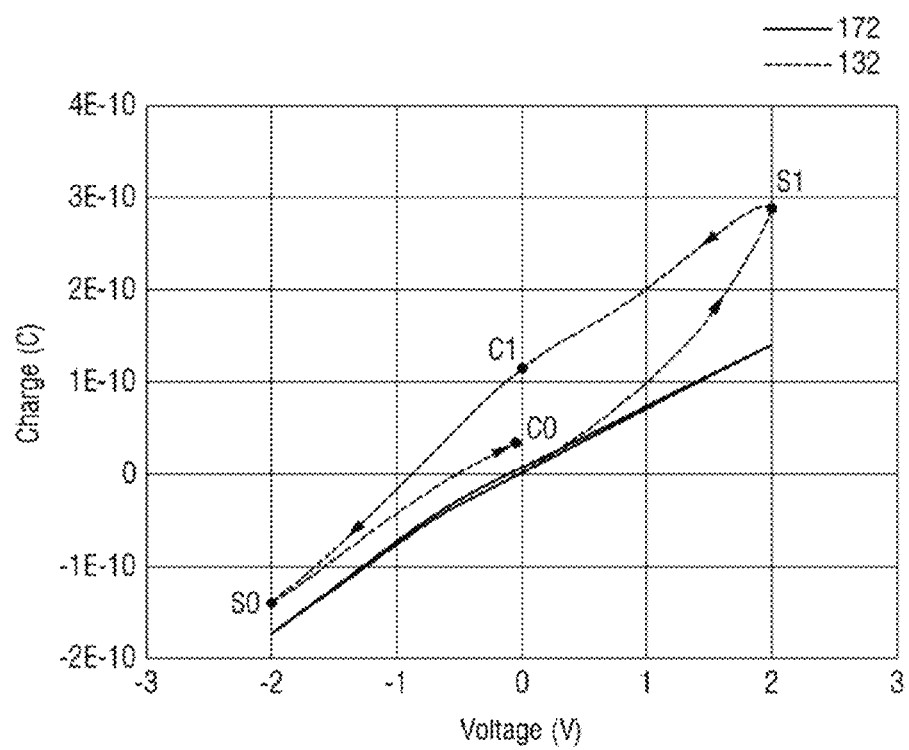
FIG. 6 is a diagram showing the operation of the semiconductor device according to some embodiments.

FIG. 2 is a view of a semiconductor device according to some embodiments. FIG. 3 is a cross-sectional view taken along A1-A1 and A2-A2 of FIG. 2. FIG. 4 is a cross-sectional view taken along B1-B1 and B2-B2 of FIG. 2. FIG. 5 is a diagram showing crystal structures of a ferroelectric insulating film and a paraelectric insulating film according to some embodiments. FIG. 6 is a diagram showing the operation of the semiconductor device according to some embodiments.

Referring to FIGS. 1 and 2, the electronic system 100 may be implemented through at least one die, and the electronic system 100 may include a first die DIE1.

The first die DIE1 may include a first region 100a and a second region 100b. The first region 100a according to some embodiments may correspond to a region corresponding to the memory 130, and the second region 100b according to some embodiments may correspond to the host processor 110 or a plurality of modules 270. The first region 100a and the second region 100b according to some embodiments may be on the same first die DIE1.

The semiconductor device according to some embodiments will be described referring to FIGS. 2 to 6.

Referring to FIGS. 2 to 6, the semiconductor device according to some embodiments may include a first fin pattern F1, a second fin pattern F2, a first gate structure 130G, a second gate structure 170G, a first source/drain pattern 135, and a second source/drain pattern 175.

A substrate 101a may be a region of the substrate corresponding with the first region 100a, and a substrate 101b may be a region of the substrate corresponding with the second region 100b. The substrate 101a and the substrate 101b according to some embodiments may be regions formed on the same die. For example, the first region 100a may be used interchangeably with the substrate 101a and the second region 100b may be used interchangeably with the substrate 101b.

The substrates 101a and 101b may be bulk silicon or SOI (silicon-on-insulator). In an implementation, the substrates 101a and 101b may be silicon substrates, or may include other material, e.g., silicon germanium, SGOI (silicon germanium on insulator), indium antimonide, lead tellurium compounds, indium arsenide, indium phosphide, gallium arsenide, or gallium antimonide.

Each of the first fin pattern F1 and the second fin pattern F2 may correspond to an active region of the fin transistor FinFet, and may be respectively on the respective substrates 101a and 101b. The first fin pattern F1 and the second fin pattern F2 may each extend lengthwise in a first direction X. The first fin pattern F1 and the second fin pattern F2 may protrude from the substrates 101a and 101b in a third direction Z.

The first fin pattern F1 and the second fin pattern F2 may be formed by etching a part of the substrates 101a and 101b, and may include an epitaxial layer that is grown from the substrates 101a and 101b. The first fin pattern F1 and the second fin pattern F2 may include silicon and germanium, which are elemental semiconductor materials. In an implementation, the first fin pattern F1 and the second fin pattern F2 may include a compound semiconductor, e.g., a group IV-IV compound semiconductor or a group III-V compound semiconductor.

The group IV-IV compound semiconductor may be, e.g., a binary compound or a ternary compound including two or more of carbon (C), silicon (Si), germanium (Ge) and tin (Sn), or a compound obtained by doping these elements with a group IV element.

The group III-V compound semiconductor may be, e.g., a binary compound, a ternary compound, or a quaternary compound formed by combining at least one of aluminum (Al), gallium (Ga) and indium (In) as a group III element with one of phosphorus (P), arsenic (As) and antimony (Sb) as a group V element.

A field insulating film 102 may be on the substrates 101a and 101b. The field insulating film 102 may be on a part of the side walls of the first fin pattern F1 and the second fin pattern F2.

The field insulating film 102 may include, e.g., an oxide film, a nitride film, an oxynitride film, or a combination film thereof. In an implementation, as illustrated in the drawings, the field insulating film 102 may be a single film, or may be a multi layer film.

The first gate structure 130G and the second gate structure 170G may be on the substrates 101a and 101b. Each of the first gate structure 130G and the second gate structure 170G may extend (e.g., lengthwise) in a second direction Y. An adjacent first gate structure 130G and second gate structure 170G may be spaced apart from each other in the first direction X.

The first gate structure 130G may be on the first fin pattern F1. The second gate structure 170G may be on the second fin pattern F2. The first gate structure 130G may intersect the first fin pattern F1. The second gate structure 170G may intersect the second fin pattern F2.

The first gate structure 130G may include, e.g., a first gate spacer 131, a ferroelectric insulating film 132, a first gate electrode 133, and a first gate capping pattern 134.

The first gate spacer 131 may be on the side wall of the first gate electrode 133. The first gate spacer 131 may define a first trench 130T to be described below.

The first gate spacer 131 may include, e.g., silicon nitride (SiN), silicon oxynitride (SiON), silicon oxide (SiO$_2$), silicon oxycarbonitride (SiOCN), silicon boronitride (SiBN), silicon oxyboronitride (SiOBN), silicon oxycarbide (SiOC), or combinations thereof.

The ferroelectric insulating film 132 may extend along an upper surface of the field insulating film 102, an upper surface of the first fin pattern F1, and at least a part of the side wall of the first gate spacer 131. The first gate electrode 133 may be on the ferroelectric insulating film 132.

The ferroelectric insulating film 132 may have ferroelectric properties. The ferroelectric insulating film 132 may include, e.g., hafnium oxide, zirconium oxide, hafnium zirconium oxide, barium strontium titanium oxide, barium titanium oxide, or lead zirconium titanium oxide. In an implementation, hafnium zirconium oxide may be a material obtained by doping hafnium oxide with zirconium (Zr). In an implementation, hafnium zirconium oxide may also be a compound of hafnium (Hf), zirconium (Zr) and oxygen (O).

The ferroelectric insulating film 132 may further include a doped dopant. In an implementation, the dopant may include, e.g., aluminum (Al), titanium (Ti), niobium (Nb), lanthanum (La), yttrium (Y), magnesium (Mg), silicon (Si), calcium (Ca), cerium (Ce), dysprosium (Dy), erbium (Er), gadolinium (Gd), germanium (Ge), scandium (Sc), strontium (Sr), or tin (Sn). The type of dopant included in the ferroelectric insulating film 132 may vary, depending on which type of ferroelectric material is included in the ferroelectric insulating film 132.

In an implementation, when the ferroelectric insulating film 132 includes hafnium oxide, the dopant included in the ferroelectric insulating film 132 film may include, e.g., gadolinium (Gd), silicon (Si), zirconium (Zr), aluminum (Al), or yttrium (Y).

In an implementation, when the dopant includes aluminum (Al), the ferroelectric insulating film 132 may include, e.g., 3 to 8 at % (atomic %) aluminum. In an implementation, a ratio of the dopant may be a ratio of aluminum to the sum of hafnium and aluminum.

In an implementation, when the dopant includes silicon (Si), the ferroelectric insulating film 132 may include, e.g., 2 to 10 at % silicon. In an implementation, when the dopant includes yttrium (Y), the ferroelectric insulating film 132 may include, e.g., 2 to 10 at % yttrium. In an implementation, when the dopant includes gadolinium (Gd), the ferroelectric insulating film 132 may include, e.g., 1 to 7 at % gadolinium. In an implementation, when the dopant includes zirconium (Zr), the ferroelectric insulating film 132 may include, e.g., 50 to 80 at % zirconium.

The ferroelectric insulating film 132 may have a thickness 132d in the third direction Z, and may have ferroelectric properties. The thickness of the ferroelectric insulating film 132 may be, e.g., 0.5 to 20 nm. In an implementation, each ferroelectric material may have different critical thickness that exhibits the ferroelectric properties, and the thickness 132d of the ferroelectric insulating film 132 may vary depending on the ferroelectric material.

The ferroelectric insulating film 132 may include a plurality of ferroelectric insulating films spaced apart from each other.

The first gate electrode 133 may be on the first fin pattern F1. The first gate electrode 133 may intersect the first fin pattern F1.

The first gate electrode 133 may include, e.g., a metal, a metal alloy, a conductive metal nitride, a metal silicide, a doped semiconductor material, a conductive metal oxide, or a conductive metal oxynitride. The first gate electrode 133 may include, e.g., titanium nitride (TiN), tantalum carbide (TaC), tantalum nitride (TaN), titanium silicon nitride (TiSiN), tantalum silicon nitride (TaSiN), tantalum titanium nitride (TaTiN), titanium aluminum nitride (TiAlN), tantalum aluminum nitride (TaAlN), tungsten nitride (WN), ruthenium (Ru), titanium aluminum (TiAl), titanium aluminum carbonitride (TiAlC—N), titanium aluminum carbide (TiAlC), titanium carbide (TiC), tantalum carbonitride (TaCN), tungsten (W), aluminum (Al), copper (Cu), cobalt (Co), titanium (Ti), tantalum (Ta), nickel (Ni), platinum (Pt), nickel platinum (Ni—Pt), niobium (Nb), niobium nitride (NbN), niobium carbide (NbC), molybdenum (Mo), molybdenum nitride (MoN), molybdenum carbide (MoC), tungsten carbide (WC), rhodium (Rh), palladium (Pd), iridium (Ir), osmium (Os), silver (Ag), gold (Au), zinc (Zn), vanadium (V), or combinations thereof. The conductive metal oxides and the conductive metal oxynitrides may include, e.g., oxidized forms of the aforementioned materials.

The first gate electrode 133 may be on both sides of a first source/drain pattern 135 to be described below. In an implementation, the first gate electrodes 133 on both sides of the first source/drain pattern 135 may be a normal gate electrode used as a gate of the transistor. In an implementation, one gate electrode on one side of the first source/drain pattern 135 may be used as a gate of a transistor, and another gate electrode on the other side of the first source/drain pattern 135 may be a dummy gate electrode.

The first gate capping pattern 134 may be on the first gate electrode 133 and the ferroelectric insulating film 132. An upper surface of the first gate capping pattern 134 may be on a same plane as (e.g., coplanar with) an upper surface of a first interlayer insulating film 104. The first gate capping pattern 134 may be between the first gate spacers 131.

The first gate capping pattern 134 may include, e.g., silicon nitride (SiN), silicon oxynitride (SiON), silicon carbonitride (SiCN), silicon oxycarbonitride (SiOCN), or combinations thereof. The first gate capping pattern 134 may include a material having an etching selectivity to the first interlayer insulating film 104.

The first source/drain pattern 135 may be on the first fin pattern F1. The first source/drain pattern 135 may be connected to the first fin pattern F1. The first source/drain pattern 135 may be included in the source/drain of a transistor that uses the first fin pattern F1 as the channel region.

The first source/drain pattern 135 may be on or adjacent to side surface of the first gate structure 130G. The first source/drain pattern 135 may be between other gate structures adjacent to each other in the first direction X. In an implementation, the first source/drain pattern 135 may be on either side of the first gate structure 130G. In an implementation, the first source/drain pattern 135 may be on or at one side of the first gate structure 130G, and may not be on or at the other side of the first gate structure 130G.

The second gate structure 170G may include, e.g., a second gate spacer 171, a paraelectric insulating film 172, a second gate electrode 173, and a second gate capping pattern 174.

Hereinafter, each of the second gate spacer 171, the paraelectric insulating film 172, the second gate electrode 173, the second gate capping pattern 174, the second fin pattern F2, and the second source/drain pattern 175 may correspond to each of the first gate spacer 131, the ferroelectric insulating film 132, the first gate electrode 133, the first gate capping pattern 134, the first fin pattern F1, and the first source/drain pattern 135.

In addition to the description of the paraelectric insulating film 172, description of each of the second gate spacer 171, the paraelectric insulating film 172, the second gate electrode 173, the second gate capping pattern 174, the second fin pattern F2, and the second source/drain pattern 175 may replace the description of each of the first gate spacer 131, the first gate electrode 133, the first gate capping pattern 134, the first fin pattern F1, and the first source/drain pattern 135.

The paraelectric insulating film 172 may have paraelectric properties. The paraelectric insulating film 172 may include, e.g., silicon oxide and a metal oxide having a high dielectric constant. The metal oxide included in the paraelectric insulating film 172 may include, e.g., hafnium oxide, zirconium oxide, or aluminum oxide.

In an implementation, the ferroelectric insulating film 132 and the paraelectric insulating film 172 may include the same material. The ferroelectric insulating film 132 may have the ferroelectric properties, and the paraelectric insulating film 172 may not have the ferroelectric properties. In an implementation, when the ferroelectric material film and the paraelectric insulating film 172 both include hafnium oxide, the crystal structure of hafnium oxide included in the ferroelectric material film may be different from the crystal structure of hafnium oxide included in the paraelectric insulating film 172.

The paraelectric insulating film 172 may have a thickness 172d in the third direction Z, and may have the paraelectric properties. The thickness 172d of the paraelectric insulating film 172 may be, e.g., 0.5 to 20 nm. The thickness of the paraelectric insulating film 172 may be the same by a formation process of the ferroelectric insulating film 132 and the paraelectric insulating film 172 to be explained below. In an implementation, a metal oxide film 105 placed on the second region 100b may be etched in the third direction Z before the process of FIG. 14 to be explained below, and the thicknesses of the ferroelectric insulating film 132 and the paraelectric insulating film 172 may differ from each other. Etching of the metal oxide film 105 may be performed, e.g., by wet etching or dry etching.

Referring to FIG. 5, the ferroelectric insulating film 132 and the paraelectric insulating film 172 according to some embodiments may commonly include a hafnium oxide having the paraelectric properties. In an implementation, the ferroelectric insulating film 132 and the paraelectric insulating film 172 may include hafnium oxides having different crystal structures from each other.

The ferroelectric insulating film 132 may have, e.g., an orthorhombic (O phase) crystal structure having an oxygen atom of asymmetric structure, and the paraelectric insulating film 172 may have, e.g., a monolithic (M phase) or tetragonal (T phase) crystal structure.

A method of forming an orthorhombic crystal structure of hafnium oxide according to some embodiments may include depositing a metal material on hafnium oxide by applying a tensile stress to the hafnium oxide and then annealing it. The hafnium oxide film sandwiched between the upper metal material and the lower metal material may be subjected to tensile stress and may have an orthorhombic crystal structure. In an implementation, as the cooling rate at the time of the annealing becomes faster, the orthorhombic crystal structure may be stabilized rapidly, and thus, the greater tensile stress may be applied to the hafnium oxide film.

The method of forming the orthorhombic crystal structure of hafnium oxide according to some embodiments may include, e.g., doping hafnium oxide with silicon (Si), zirconium (Zr), aluminum (Al), or the like. Hafnium of the hafnium oxide may have an asymmetric structure due to the doped dopants, and the hafnium oxide may have an orthorhombic crystal structure.

The method of forming the orthorhombic crystal structure of the hafnium oxide according to some embodiments may include inducing a deficiency of oxygen in hafnium oxide at the time of vapor deposition of hafnium oxide or in a process after the vapor deposition. Induction of the deficiency of oxygen may cause asymmetry of the crystal structure, and may form the orthorhombic crystal structure through the asymmetry. The method of inducing the deficiency of oxygen may include, e.g., applying an electric field (E-field) to hafnium oxide. For the formation of the orthorhombic crystal structure in the actual process, one of the above methods may not be selectively used, but a plurality of methods may be used together.

Referring to FIG. 6, the ferroelectric insulating film 132 may have ferroelectric properties through the orthorhombic crystal structure, charge may not be induced to the ferroelectric insulating film 132 only depending on both end application voltage V through the aforementioned properties, and the ferroelectric insulating film 132 may have PV (polarization-voltage) hysteresis properties which also consider the procedures by which the material has passed.

In an implementation, when 0 V is applied to the ferroelectric insulating film 132 of a first status S1, a first charge C1 may be induced to the ferroelectric insulating film 132, and when 0 V is applied to the ferroelectric insulating film 132 of a $0^{th}$ status S0, a $0^{th}$ charge C0 may be induced to the ferroelectric insulating film 132.

The first interlayer insulating film 104 may be on an etching stop film. The interlayer insulating film may be on the field insulating film 102, the first source/drain pattern 135, and the second source/drain pattern 175. The first interlayer insulating film 104 may not cover the upper surfaces of the first gate capping pattern 134 and the second gate capping pattern 174. In an implementation, the upper surface of the second interlayer insulating film 104 may be on the same plane as the upper surfaces of the first gate capping pattern 134 and the second gate capping pattern 174.

The first interlayer insulating film 104 may include, e.g., silicon oxide, silicon nitride, silicon oxynitride, or a low dielectric constant material. The low dielectric constant material may include, e.g., Fluorinated TetraEthylOrthoSilicate (FTEOS), Hydrogen SilsesQuioxane (HSQ), Bis-benzoCycloButene (BCB), TetraMethylOrthoSilicate (TMOS), OctaMethyleyCloTetraSiloxane (OMCTS), HexaMethylDiSiloxane (HMDS), TriMethylSilyl Borate (TMSB), DiAcetoxyDitertiaryButoSiloxane (DADBS), TriMethylSilil Phosphate (TMSP), PolyTetraFluoroEthylene (PTFE), TOSZ (Tonen SilaZen), FSG (Fluoride Silicate Glass), polyimide nanofoams such as polypropylene oxide, CDO (Carbon Doped silicon Oxide), OSG (Organo Silicate Glass), SiLK, Amorphous Fluorinated Carbon, silica aerogels, silica xerogels, mesoporous silica, or combinations thereof.

A second interlayer insulating film 103 may be on the upper surfaces of the first interlayer insulating film 104, the first gate capping pattern 134, and the second gate capping pattern 174. In an implementation, the second interlayer insulating film 103 may include, e.g., silicon oxide, silicon nitride, silicon oxynitride, or a low dielectric constant material, or may include the same material as the first interlayer insulating film 104.

FIGS. 7 to 19 are stages in a method of manufacturing the semiconductor device according to some embodiments. FIGS. 7 to 19 are cross-sectional views taken along A1-A1 and A2-A2 of FIG. 2. The following manufacturing method will be described in terms of a cross-section.

Figure 7:
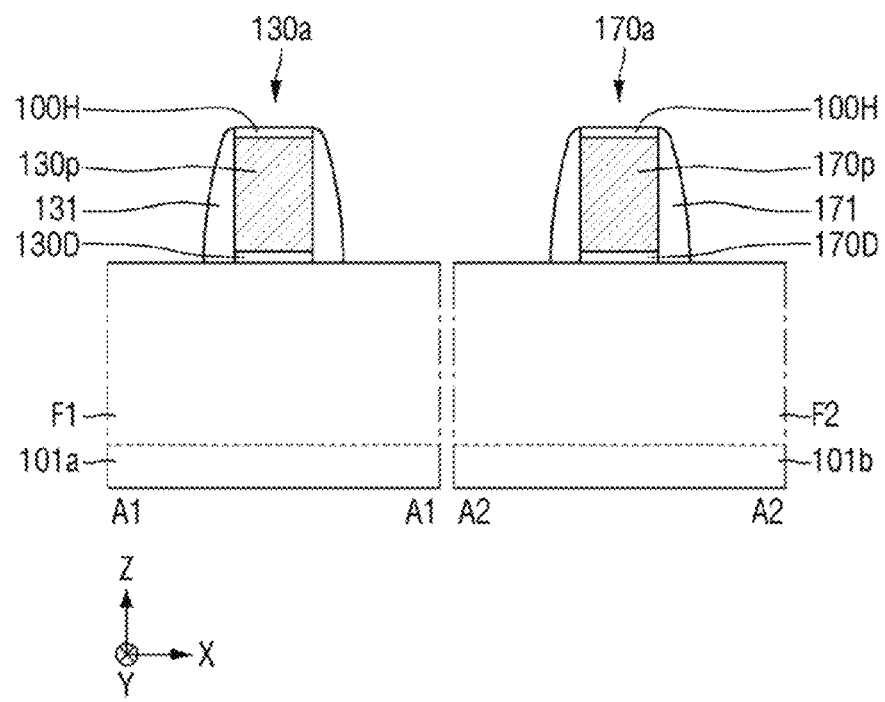
FIGS. 7 to 19 are stages in a method of manufacturing the semiconductor device according to some embodiments.

Referring to FIG. 7, a first fin pattern F1 and a second fin pattern F2 may be formed on the substrates 101a and 101b.

Subsequently, a first dummy gate structure 130a and a second dummy gate structure 170a may be respectively formed on the first fin pattern F1 and the second fin pattern F2. The first dummy gate structure 130a may include a first dummy gate insulating film 130D, a first dummy gate electrode 130p, a dummy gate capping film 100H, and a first gate spacer 131. The second dummy gate structure 170a may include a second dummy gate insulating film 170D, a second dummy gate electrode 170p, a dummy gate capping film 100H, and a second gate spacer 171.

In an implementation, the first dummy gate insulating film 130D may include, e.g., silicon oxide. The first dummy gate electrode 130p may include, e.g., polysilicon. The dummy gate capping film 100H may include, e.g., silicon nitride, and description of the second dummy gate insulating film 170D and the second dummy gate electrode 170p may be the same as that of the first dummy gate insulating film 130D and the first dummy gate electrode 130p.

Figure 8:
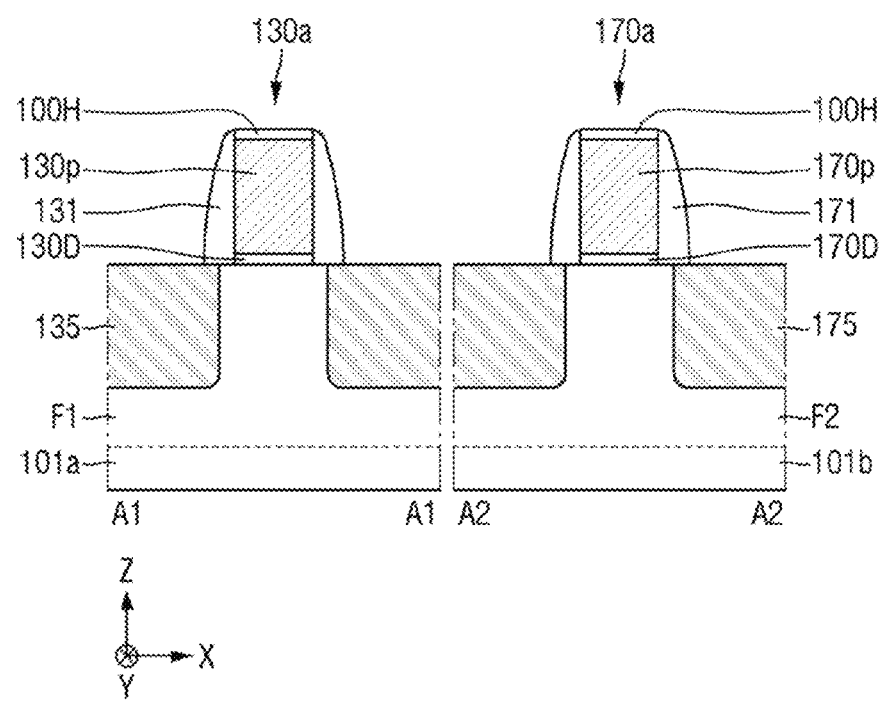

Referring to FIG. 8, the first source/drain pattern 135 and the second source/drain pattern 175 may be respectively formed on the first fin pattern F1 and the second fin pattern F2. As described above, the first source/drain pattern 135 and the second source/drain pattern 175 may be respectively formed on or adjacent to the side surfaces of the first dummy gate structure 130a and the second dummy gate structure 175a.

Figure 9:
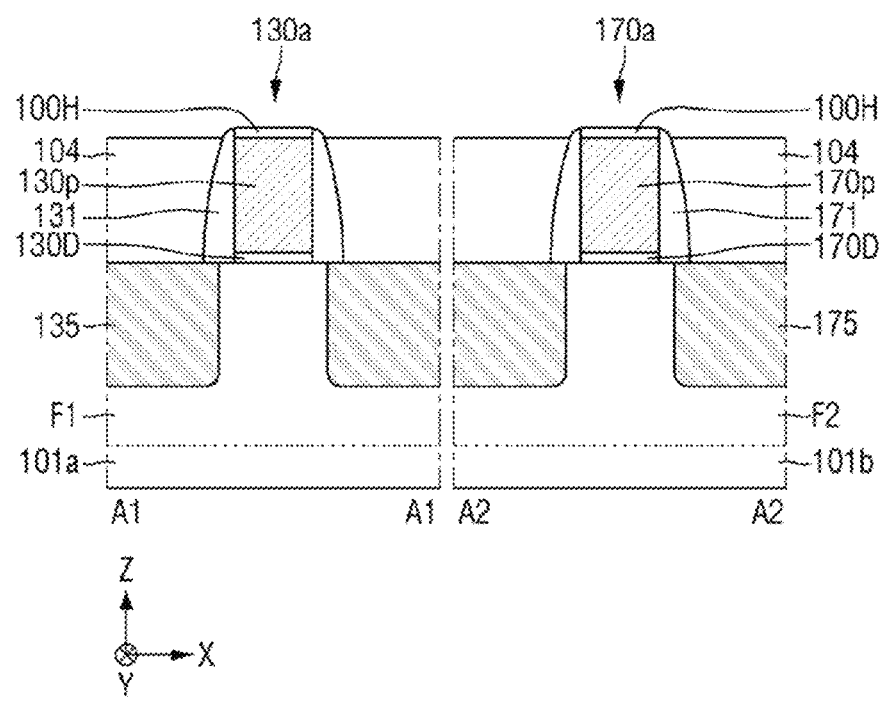

Referring to FIG. 9, the first interlayer insulating film 104 may be formed to cover the upper surfaces of the first source/drain pattern 135 and the second source/drain pattern 175 and the side walls of the first gate spacer 131 and the second gate spacer 171.

Figure 10:
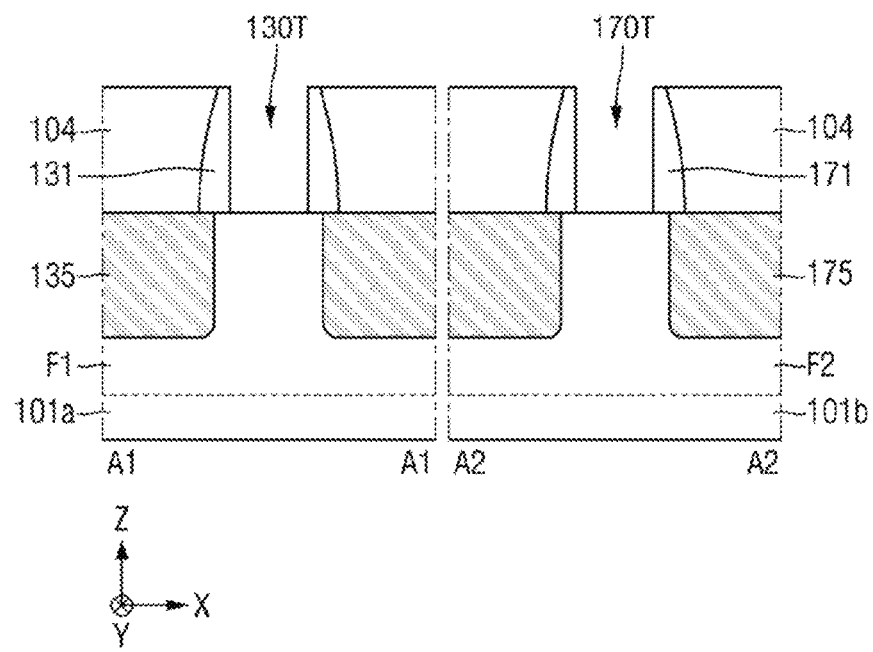

Referring to FIG. 10, the dummy gate capping film 100H, the first dummy gate insulating film 130D, the first dummy gate electrode 130p, the second dummy gate insulating film 170D, and the second dummy gate electrode 170p may be removed to expose at least a part of the first fin pattern F1 and the second fin pattern F2.

With the exposure of the first fin pattern F1 and the second fin pattern F2, a first trench 130T (defined by the first gate spacer 131) and a second trench 170T (defined by the second gate spacer 171) may be formed.

Figure 11:
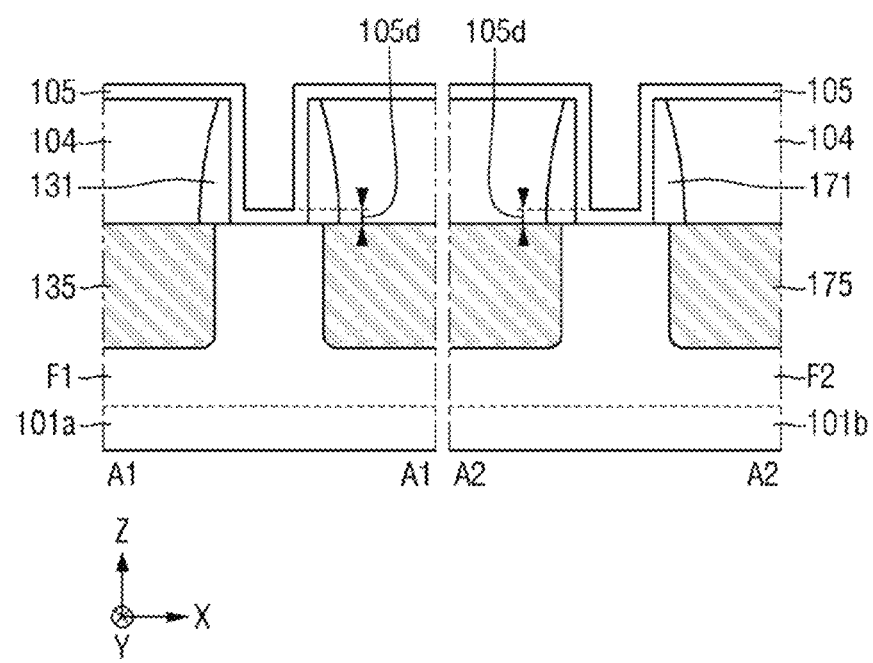

Referring to FIG. 11, a metal oxide film 105 may be formed along the exposed surfaces of the first interlayer insulating film 104, the first gate spacer 131, the second gate spacer 171, the first fin pattern F1, and the second fin pattern F2.

The metal oxide film 105 may include, e.g., hafnium oxide or zirconium oxide.

In an implementation, the metal oxide film 105 may further include a dopant. In an implementation, the dopant may include e.g., aluminum (Al), titanium (Ti), niobium (Nb), lanthanum (La), yttrium (Y), magnesium (Mg), silicon (Si), calcium (Ca), cerium (Ce), dysprosium (Dy), erbium (Er), gadolinium (Gd), germanium (Ge), scandium (Sc), strontium (Sr), or tin (Sn)

A thickness 105d (in the third direction X) of the metal oxide film 105 may be within a range of 1.5 nm to 20 nm.

In an implementation, the metal oxide film 105 may be formed, e.g., through an atomic deposition (ALD), a chemical vapor deposition (CVD), a physical vapor deposition (PVD), or a pulsed laser deposition (PLD).

Figure 12:
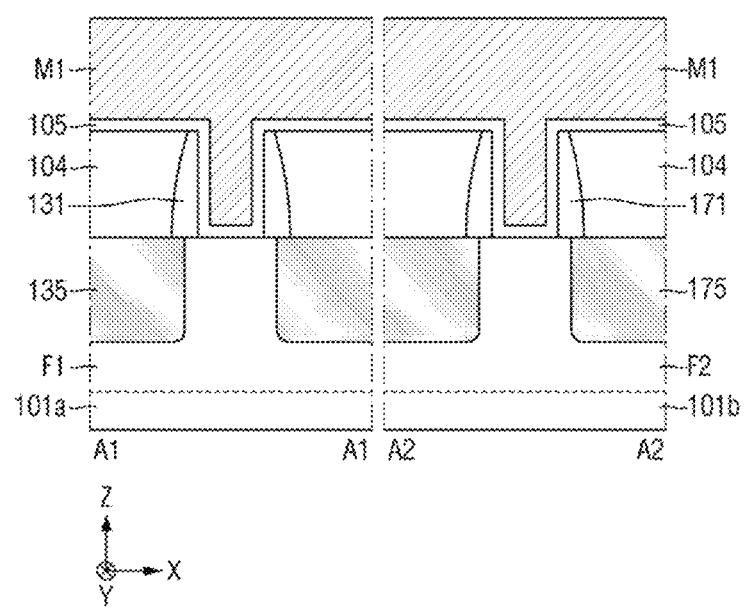

Referring to FIG. 12, a first upper metal material film M1 may be formed on the metal oxide film 105.

The first upper metal material (e.g., metal-containing) film M1 may include, e.g., titanium (Ti), titanium nitride (TiN), tantalum (Ta), tantalum nitride (TaN), tungsten (W), tungsten nitride (WN), ruthenium (Ru), ruthenium oxide (RuOx), iridium (Ir), platinum (Pt), or molybdenum (M).

In an implementation, a method of performing the vapor deposition to include the dopant of the metal oxide film 105 when forming the first upper metal material film M1 so that the metal oxide film 105 may be doped may be performed. In an implementation, a dopant film may be formed between the metal oxide film 105 and the first upper metal material film M1 to form the metal oxide film 105.

Figure 13:
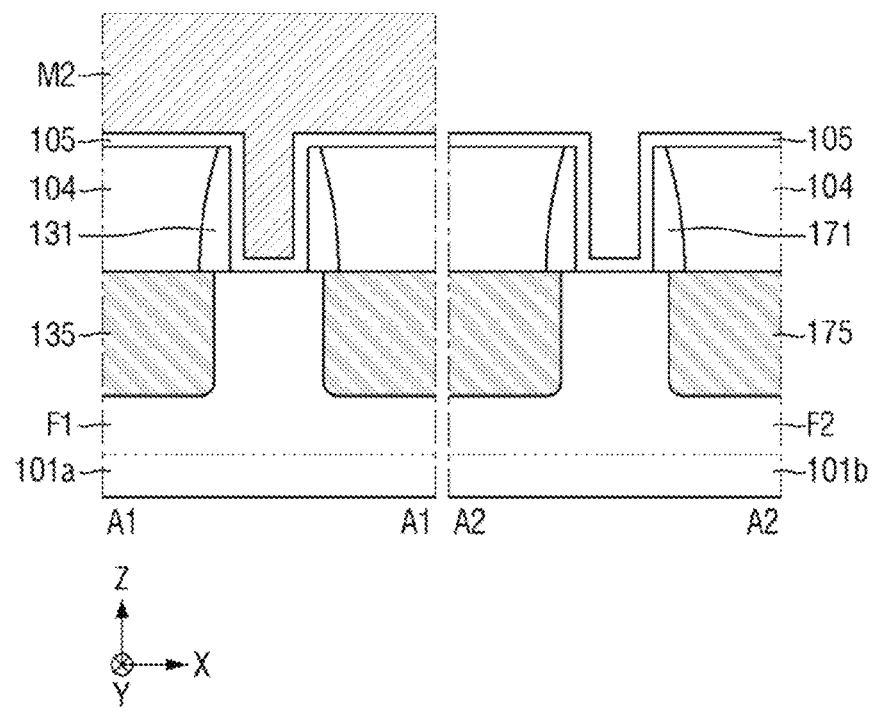

Referring to FIG. 13, a portion of the first upper metal material film M1 overlapping the substrate 101b (e.g., corresponding to the second region 100b) in a planar manner or in the third direction X may be removed through patterning. Accordingly, a remaining portion of the first upper metal material film M1 may be a second upper metal material film M2 overlapping the substrate 101a (corresponding to the first region 100a) in the third direction X, due to the removal operation.

Figure 14:
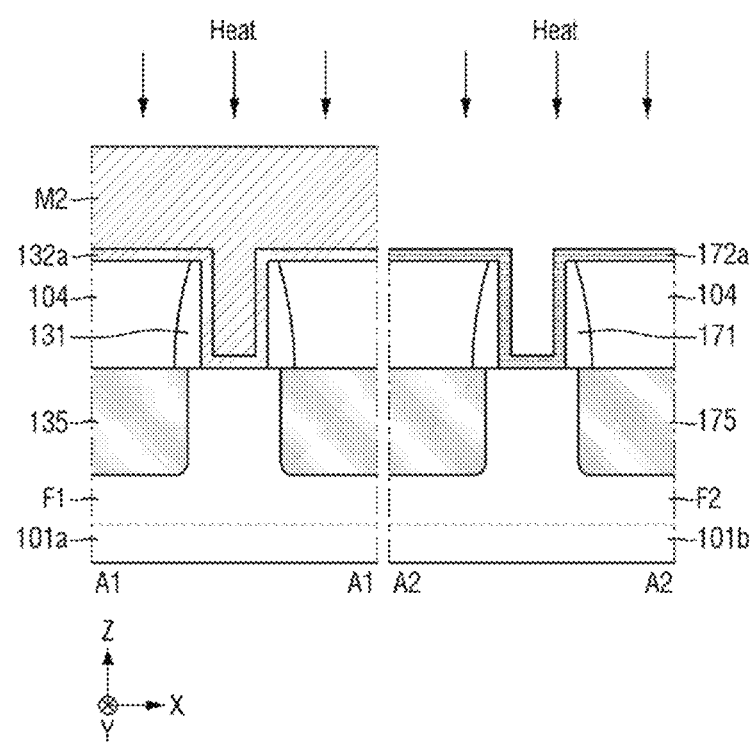

Referring to FIG. 14, the metal oxide film 105 and the second upper metal material film M2 may be annealed at the same time, a ferroelectric insulating film 132a may be formed on the substrate 101a of the first region 100a, and a paraelectric insulating film 172a may be formed on the substrate 101b of the second region 100b.

At least a part of the metal oxide film 105 on the first region 100a may be annealed, while being in contact with the substrate 101a and the second upper metal material film M2. At least a part of the metal oxide film 105 on the second region 100b may be annealed, while being exposed (e.g., uncovered) by the second upper metal material film M2. Therefore, post metal annealing may be performed on the substrate 101a of the first region 100a, and post deposition annealing may be performed on the substrate 101*b* of the second region 100*b* at the same time.

The annealing may be performed within a temperature range of, e.g., 300° C. to 1,100° C. The annealing may include, e.g., rapid thermal annealing, laser annealing, or flash annealing.

In an implementation, the ferroelectric insulating film and the paraelectric insulating film may be simultaneously formed on the same die through the operation of FIG. 14, and the efficiency of the process of the semiconductor device process may be improved.

Figure 15:
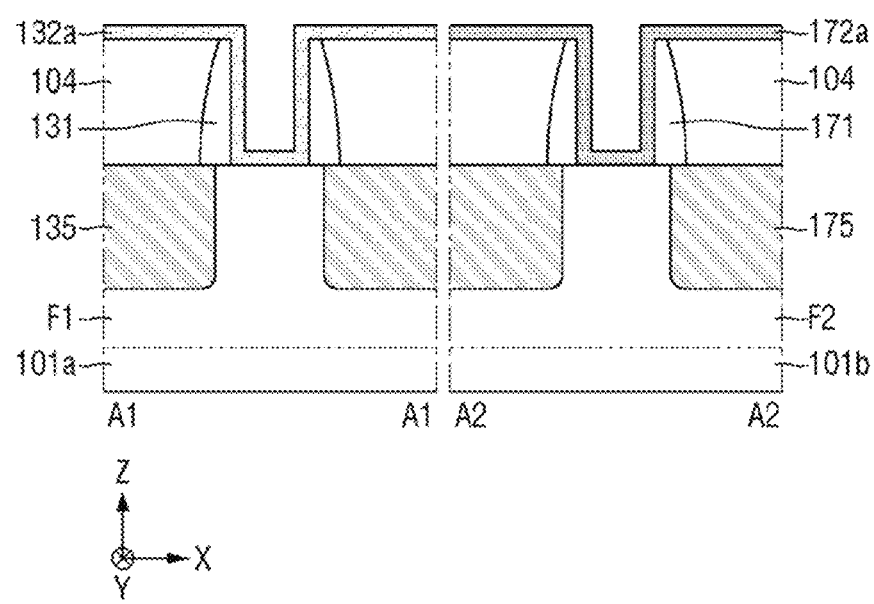

Referring to FIG. 15, the second upper metal material film M2 on the ferroelectric insulating film 132*a* may be removed.

Figure 16:
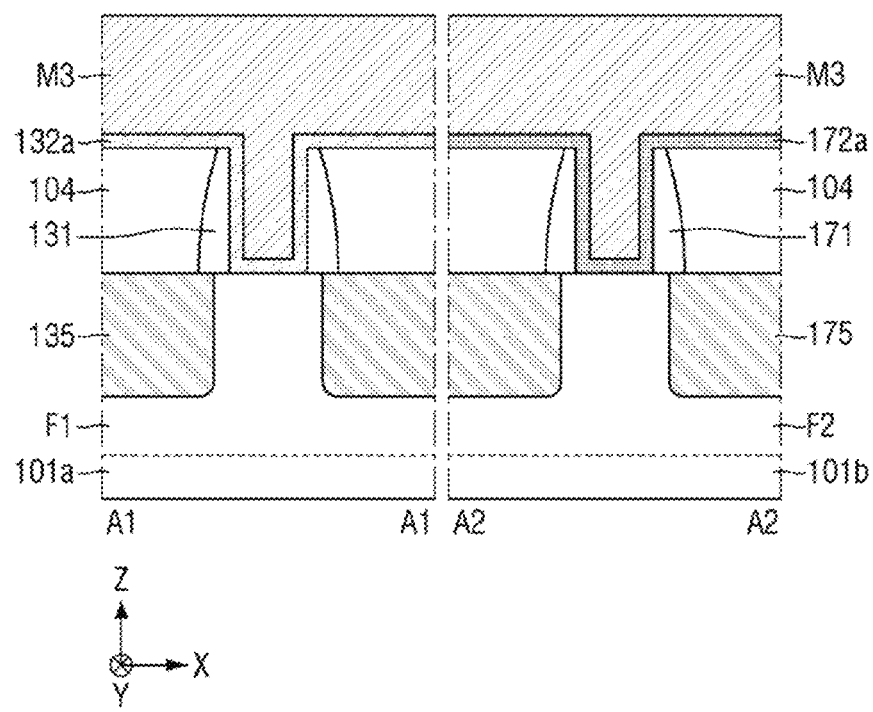

Referring to FIG. 16, a third upper metal material film M3 (that covers the ferroelectric insulating film 132*a* and the paraelectric insulating film 172*a*) may be formed.

Figure 17:
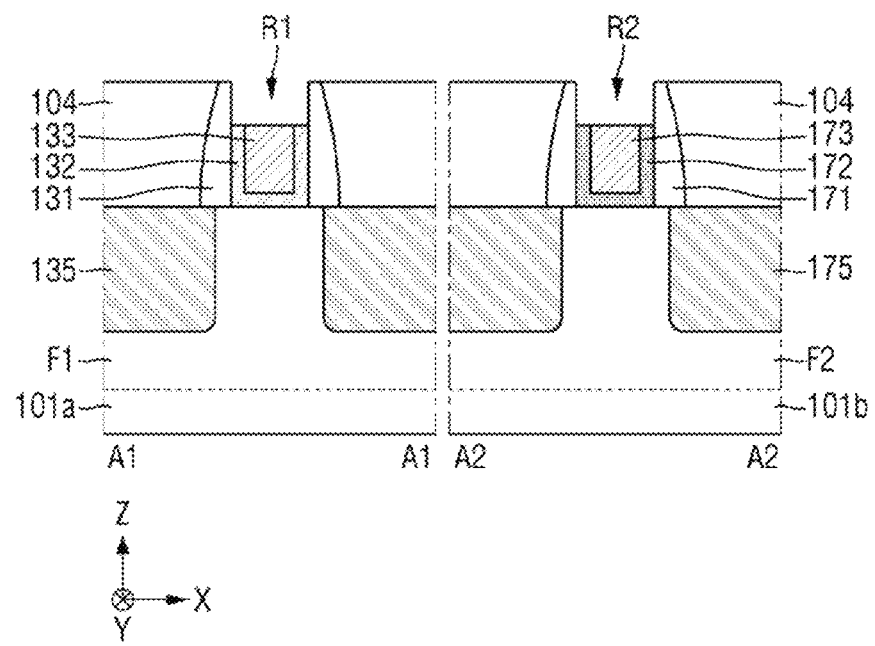

Referring to FIG. 17, the first gate electrode 133, the second gate electrode 173, the ferroelectric insulating film 132, and the paraelectric insulating film 172 may be formed by performing a flattening process (e.g., CMP) and a patterning operation using the etching selectivity on the third upper metal material film M3, and the first recess R1 and the second recess R2 respectively corresponding to the first gate electrode 133 and the second gate electrode 173 may be formed.

Figure 18:
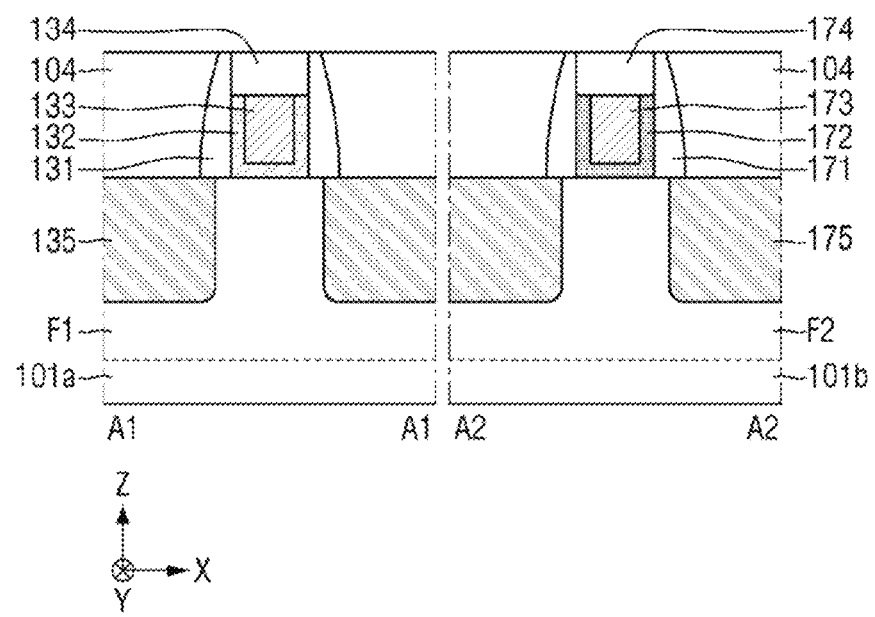

Referring to FIG. 18, the first gate capping pattern 134 and the second gate capping pattern 174 may be formed in the first recess R1 and the second recess R2, respectively.

Figure 19:
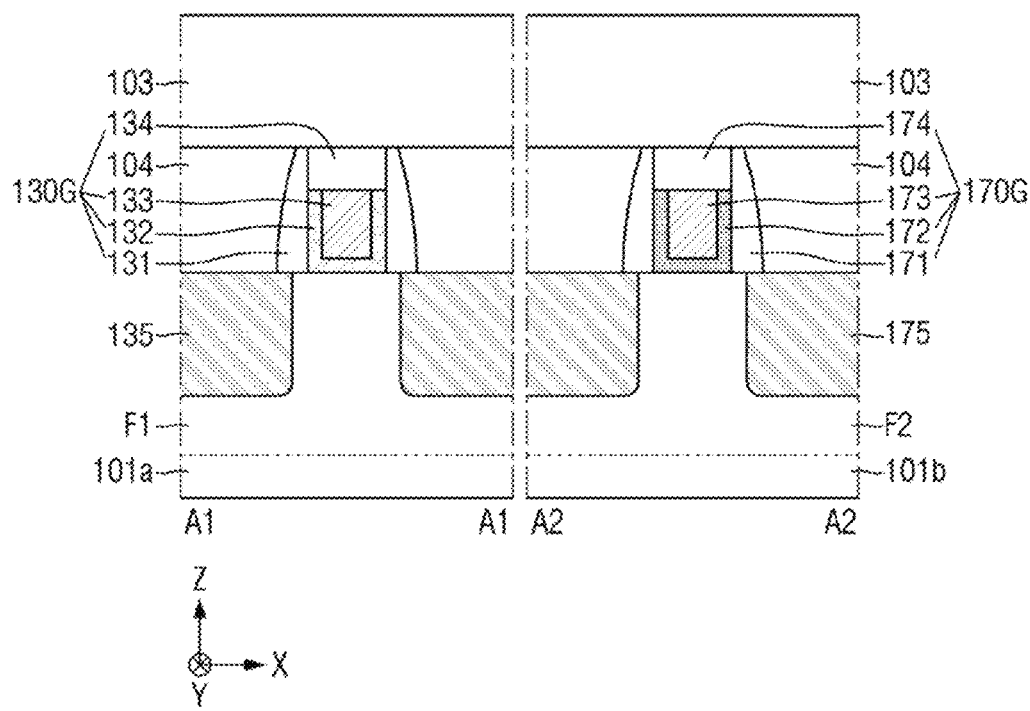

Referring to FIG. 19, the second interlayer insulating film 103 may be formed on and cover the upper surfaces of the first interlayer insulating film 104, the first gate capping pattern 134, and the second gate capping pattern 174.

Figure 20:
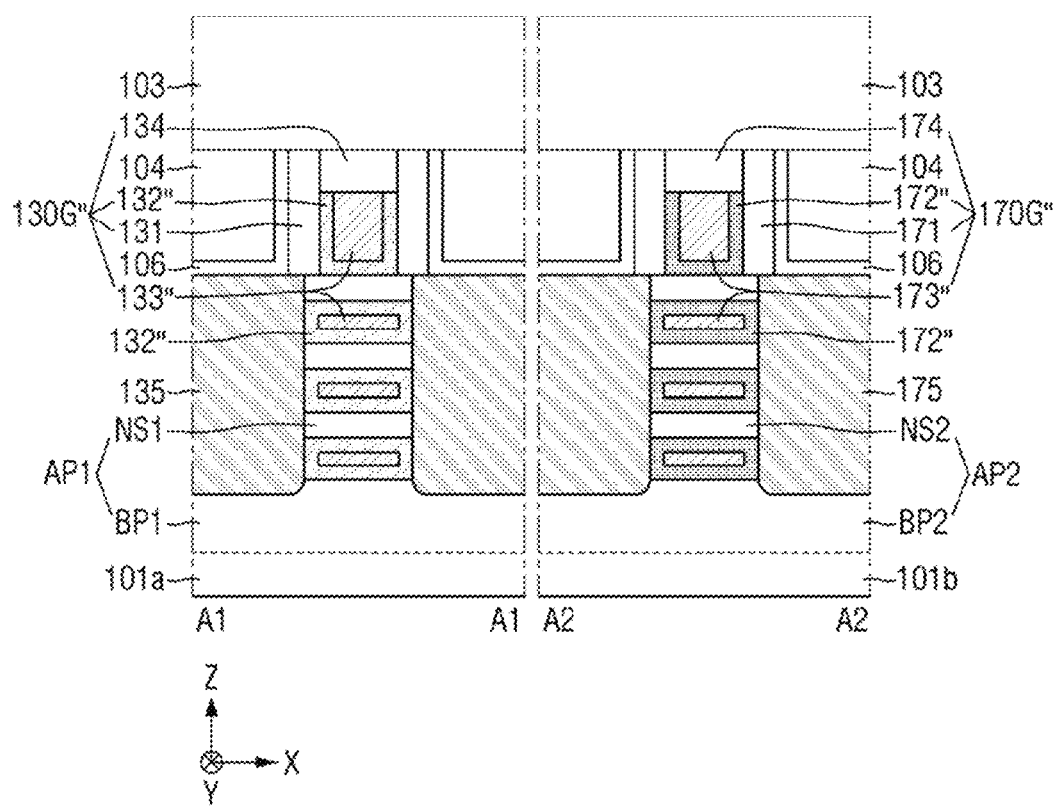
FIGS. 20 and 21 are diagrams of a semiconductor device according to some other embodiment.
Figure 21:
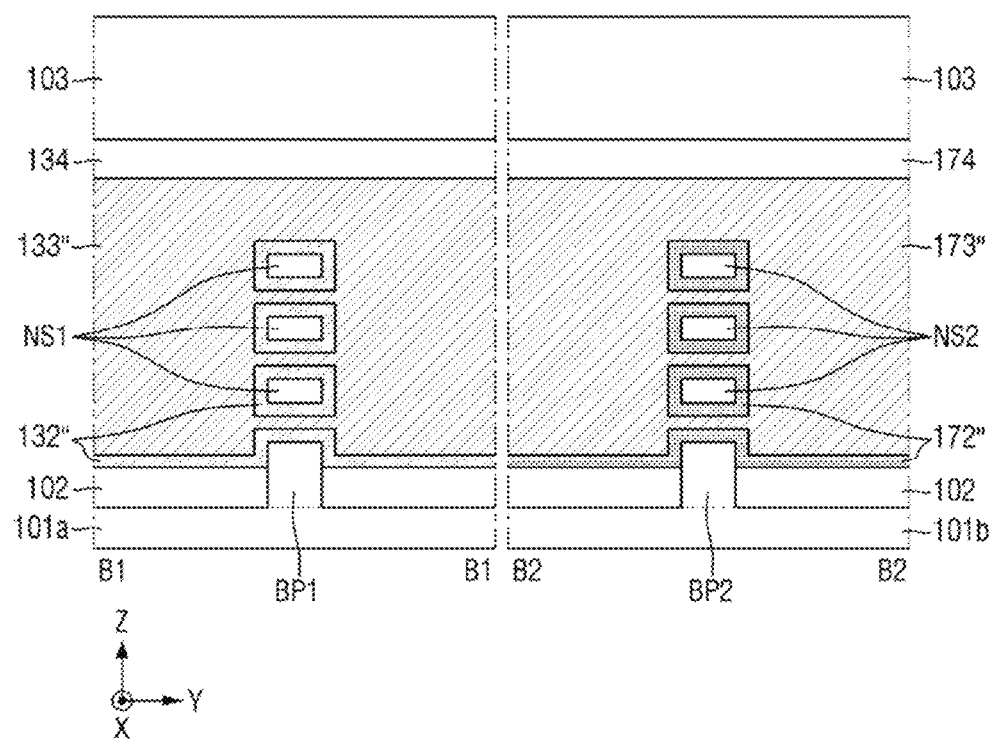

FIGS. 20 and 21 are diagrams of a semiconductor device according to some other embodiment. Hereinafter, the semiconductor device according to some other embodiments will be described referring to FIGS. 20 and 21. Differences from the semiconductor devices shown in FIGS. 3 to 4 may be mainly described.

The semiconductor device according to some embodiments may further include a first active pattern AP1, a second active pattern AP2, and an etching stop film 106. The first active pattern AP1 and the second active pattern AP2 may be respectively on the first region 100*a* and the second region 100*b* and may extend in the first direction X. The first active pattern AP1 and the second active pattern AP2 may respectively correspond to the first fin pattern F1 and the second fin pattern F2 of FIGS. 3 and 4.

The first active pattern AP1 may be on the substrate 101*a*. The first active pattern AP1 may extend lengthwise in the first direction X. In an implementation, the first active pattern AP1 may be on a region on which a NMOS is formed.

The first active pattern AP1 may be a multi-channel active pattern. In the semiconductor device according to some embodiments, the first active pattern AP1 may include a first lower pattern BP1 and a plurality of first sheet patterns NS1.

The first lower pattern BP1 may protrude from the substrate 101*a*. The first lower pattern BP1 may extend lengthwise in the first direction X.

A plurality of first sheet patterns NS1 may be on the first lower pattern BP1. The plurality of first sheet patterns NS1 may be spaced apart from the first lower pattern BP1 in the third direction Z. In an implementation, the third direction X may be a thickness direction of the substrates 101*a* and 101*b*.

In an implementation, as illustrated in the drawings, three first sheet patterns NS1 may be included, or other numbers thereof may be included.

The first lower pattern BP1 may be formed by etching a part of the substrate 101*a*, and may include an epitaxial layer that is grown from the substrate. The first lower pattern BP1 may include silicon or germanium, which are elemental semiconductor materials. In an implementation, the first lower pattern BP1 may include a compound semiconductor, e.g., a group IV-IV compound semiconductor or a group compound semiconductor.

The group IV-IV compound semiconductor may be, e.g., a binary compound or a ternary compound including two or more of carbon (C), silicon (Si), germanium (Ge) and tin (Sn), or a compound obtained by doping these elements with a group IV element.

The group III-V compound semiconductor may be, e.g., a binary compound, a ternary compound, or a quaternary compound formed by combining aluminum (Al), gallium (Ga), or indium (In) as a group III element with phosphorus (P), arsenic (As), or antimony (Sb) as a group V element.

The first sheet pattern NS1 may include, e.g., silicon or germanium (which is an elemental semiconductor material), a group IV-IV compound semiconductor, or a group compound semiconductor. In an implementation, each first sheet pattern NS1 may include the same material as the first lower pattern BP1, or may include a material different from the first lower pattern BP1.

In the semiconductor device according to some embodiments, the first lower pattern BP1 may be a silicon lower pattern including silicon, and the first sheet pattern NS1 may be a silicon sheet pattern including silicon.

A width of the first sheet pattern NS1 in the first direction X may be increased or decreased in proportion to a width of the first lower pattern BP1 in the first direction X. In an implementation, as illustrated in the drawings, the widths in the first direction X of the first sheet patterns NS1 stacked in the third direction Z may be the same, or may be different. In an implementation, as it goes away from the first lower pattern BP1, the width in the first direction X of the first sheet patterns NS1 stacked in the third direction X may decrease.

In an implementation, the field insulating film 102 may cover at least a part of the side wall of the first lower pattern BP1. In such a case, a part of the first lower pattern BP1 may protrude in the third direction Z from or above the upper surface of the field insulating film 102.

Each first sheet pattern NS1 may be higher than the upper surface of the field insulating film 102. The field insulating film 102 may include, e.g., an oxide film, a nitride film, an oxynitride film, or a combination film thereof. In an implementation, as illustrated in the drawings, the field insulating film 102 may be a single film, or a multi layer film.

A ferroelectric insulating film 132" may be formed of the same material as the ferroelectric insulating film 132 of FIGS. 3 and 4. In an implementation, the ferroelectric insulating film 132" may extend along the upper surface of the field insulating film 102 and the upper surface of the first lower pattern BP1. The ferroelectric insulating film 132" may wrap (e.g., may surround) the first sheet pattern NS1. The ferroelectric insulating film 132" may extend (e.g., conformally) along a periphery of the first sheet pattern NS1. A first gate electrode 133" may be on the ferroelectric insulating film 132". The ferroelectric insulating film 132" may be between (e.g., may completely separate) the first gate electrode 133" and the first sheet pattern NS1.

The first source/drain pattern 135 may be connected to the first sheet pattern NS1.

The side wall of the first source/drain pattern 135 may be defined by the first nanosheet NS1 and a first gate structure 130G". In an implementation, the ferroelectric insulating film 132" of the first gate structure 130G" may define a part of the first source/drain pattern 135.

An etching stop film 106 may be on the upper surface of the field insulating film 102, the side wall of the first gate structure 130G", the upper surface of the first source/drain pattern 135, and the side wall of the first source/drain pattern 135. The etching stop film 106 may include a material having an etching selectivity to an interlayer insulating film 104 to be described below. The etching stop film 106 may include, e.g., silicon nitride (SiN), silicon oxynitride (SiON), silicon oxycarbonitride (SiOCN), silicon boronitride (SiBN), silicon oxyboronitride (SiOBN), silicon oxycarbide (SiOC), or combinations thereof.

The second active pattern AP2 may include a second lower pattern BP2 and a plurality of second sheet patterns NS2, and the second lower pattern BP2 and the plurality of second sheet patterns NS2 may correspond to (e.g., may be similar in structure and materials relative to) the first lower pattern BP1 and the plurality of first sheet patterns NS1. In an implementation, the placement between the second active pattern AP2, the paraelectric insulating film 172", and the second gate electrode 173" may also correspond to the placement between the first active pattern AP1, the ferroelectric insulating film 132" and the first gate electrode 133", and the second active pattern AP2 may be understood based on the explanation of the first active pattern AP1.

FIGS. 22 to 28 are stages in a method of manufacturing the semiconductor device corresponding to FIGS. 20 and 21. Hereinafter, the semiconductor device according to some other embodiments will be described referring to FIGS. 22 to 28. Differences from the method of manufacturing the semiconductor device shown in FIGS. 7 to 19 may be mainly described.

Figure 22:
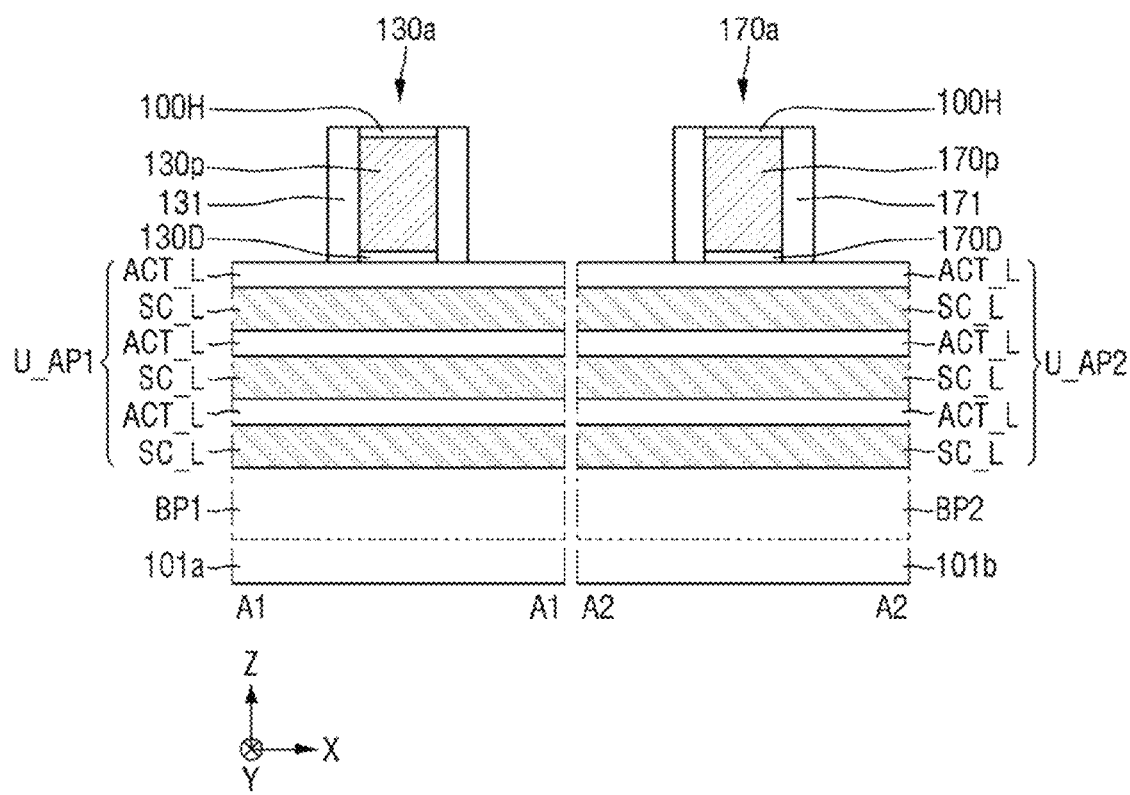
FIGS. 22 to 28 are stages in a method of manufacturing the semiconductor device of FIGS. 20 and 21.

Referring to FIG. 22, a first lower pattern BP1/first upper pattern structure U_AP1 and a second lower pattern BP2/second upper pattern structure U_AP2 may be formed on the substrates 101a and 101b.

The first upper pattern structure U_AP1 and the second upper pattern structure U_AP2 may be respectively on the first lower pattern BP1 and the second lower pattern BP2. Each of the first upper pattern structure U_AP1 and the second upper pattern structure U_AP2 may include a sacrificial pattern SC_L and an active pattern ACT_L which are alternately stacked on each of the first lower pattern BP1 and the second lower pattern BP2.

In an implementation, the sacrificial pattern SC_L may include a silicon-germanium film. The active pattern ACT_L may include a silicon film.

Subsequently, a first dummy gate structure 130a and a second dummy gate structure 170a may be respectively formed on the first upper pattern structure U_AP1 and the second upper pattern structure U_AP2.

Figure 23:
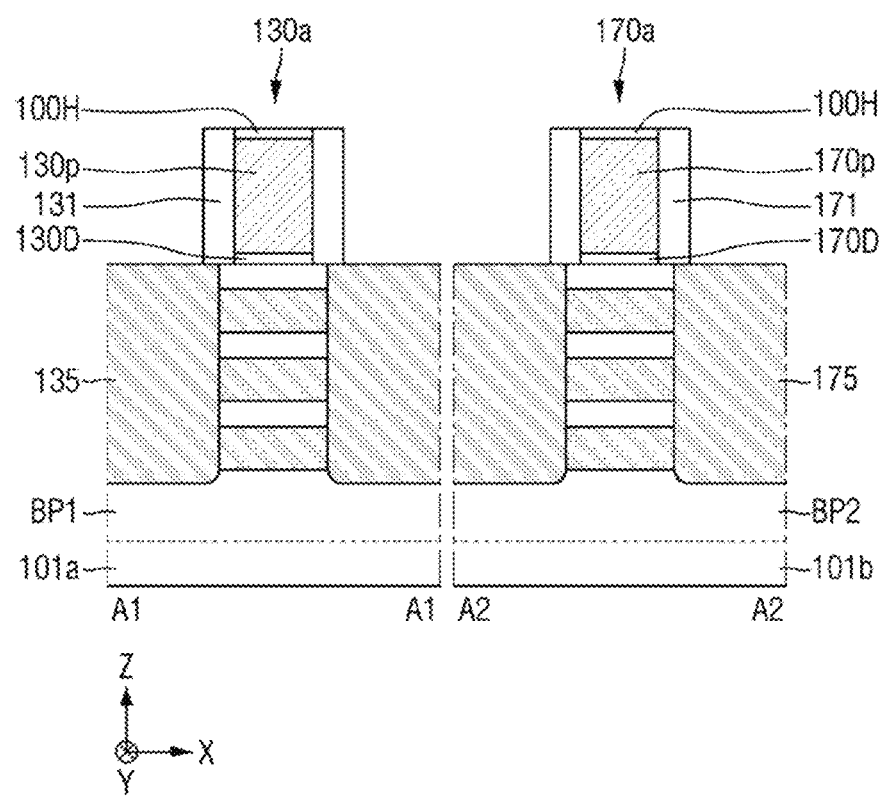

Referring to FIG. 23, a first source/drain pattern 135 and a second source/drain pattern 175 may be respectively formed inside or adjacent to the first dummy gate structure 130a and the second dummy gate structure 170a, using the first dummy gate structure 130a and the second dummy gate structure 170a as masks.

Figure 24:
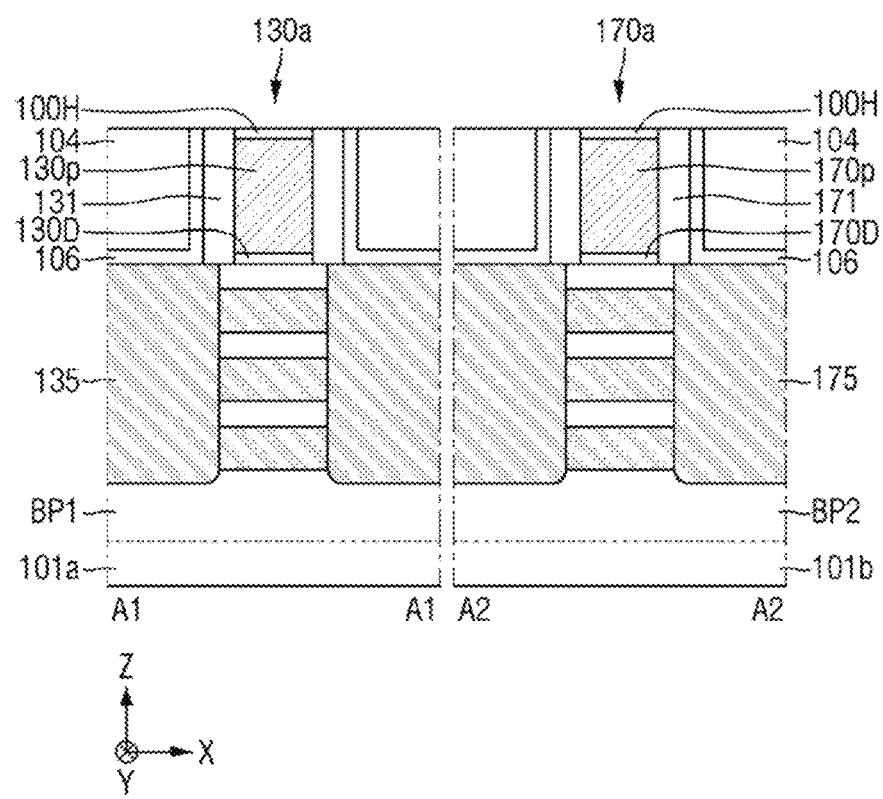

Referring to FIG. 24, an etching stop film 106 and a first interlayer insulating film 104 may be sequentially formed on the first source/drain pattern 135 and the second source/drain pattern 175.

Figure 25:
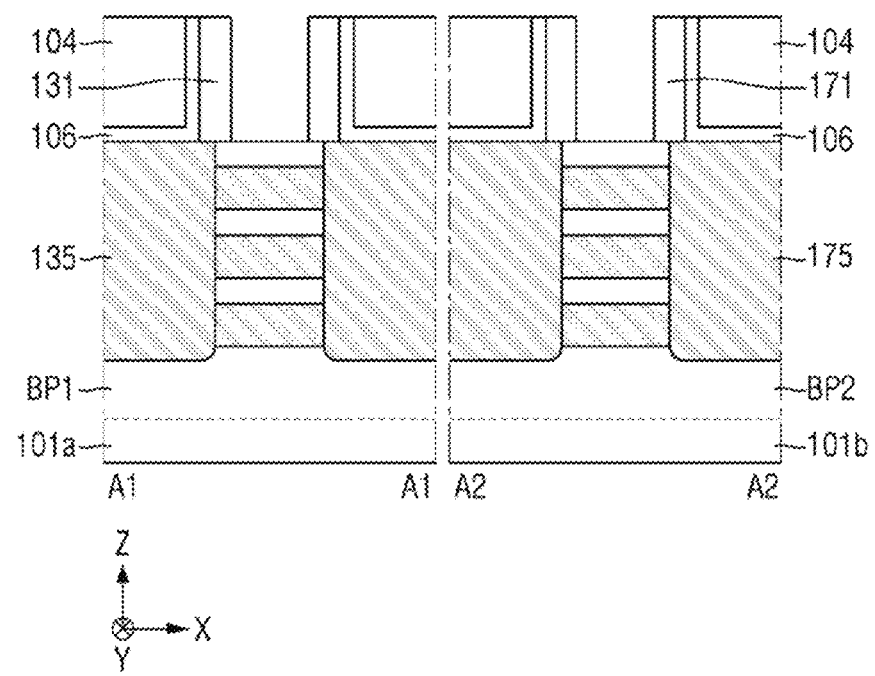

Subsequently, referring to FIG. 25, the upper surfaces of the first and second dummy gate electrodes 130p and 170p may be exposed by removing a part of the first interlayer insulating film 104, a part of the etching stop film 106, and the dummy gate capping film 100H, and the first upper pattern structure U_AP1 and the second upper pattern structure U_AP2 between the first and second gate spacers 131 and 171 may be exposed, by removing the first and second dummy gate insulating films 130D and 170D and the first and second dummy gate electrodes 130p and 170p.

Figure 26:
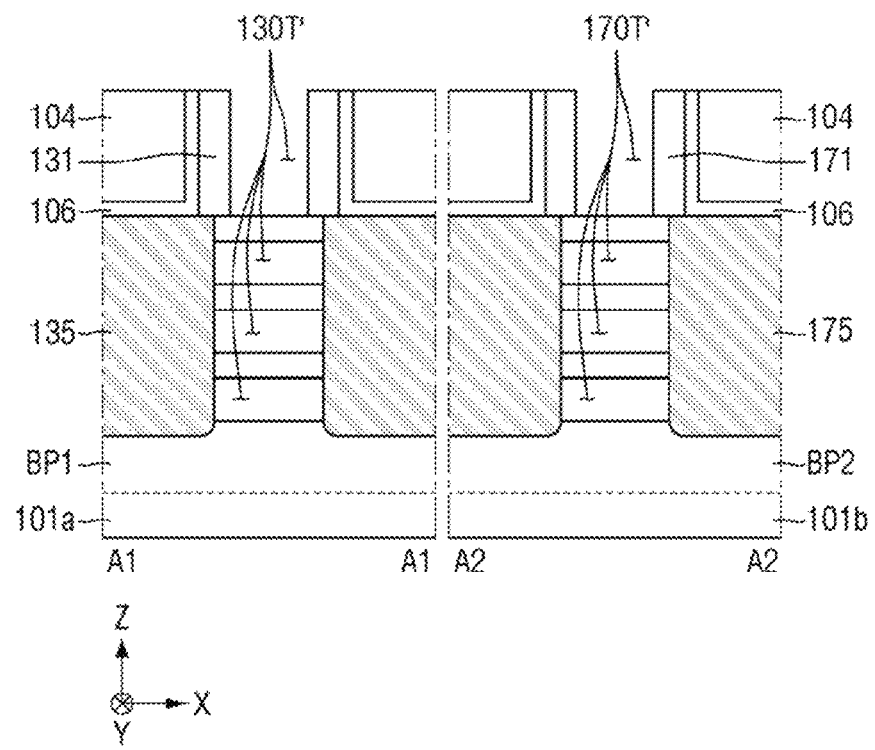

Referring to FIG. 26, the sacrificial pattern SC_L may be removed to form the first sheet pattern NS1 and the second sheet pattern NS2. Accordingly, the first gate trenches 130T' and 170T' may be respectively formed between the first gate spacers 131 and the second gate spacers 171 and the first source/drain patterns 135 and the second source/drain patterns 175.

When the sacrificial pattern SC_L is removed, the first and second source/drain patterns 135 and 175 may be exposed.

Figure 27:
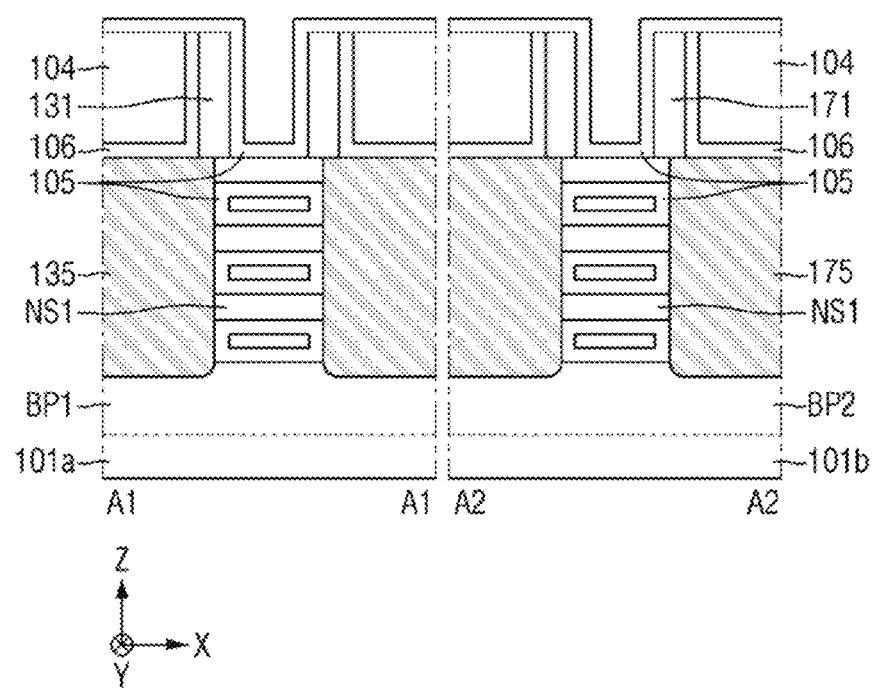

Referring to FIG. 27, a metal oxide film 105 may be formed on the upper surfaces of the first interlayer insulating film 104, the first gate spacer 131 and the second gate spacer 171, the upper surfaces of the first and second sheet patterns NS1 and NS2, and the side walls of the first and second source/drain patterns 135 and 175.

Figure 28:
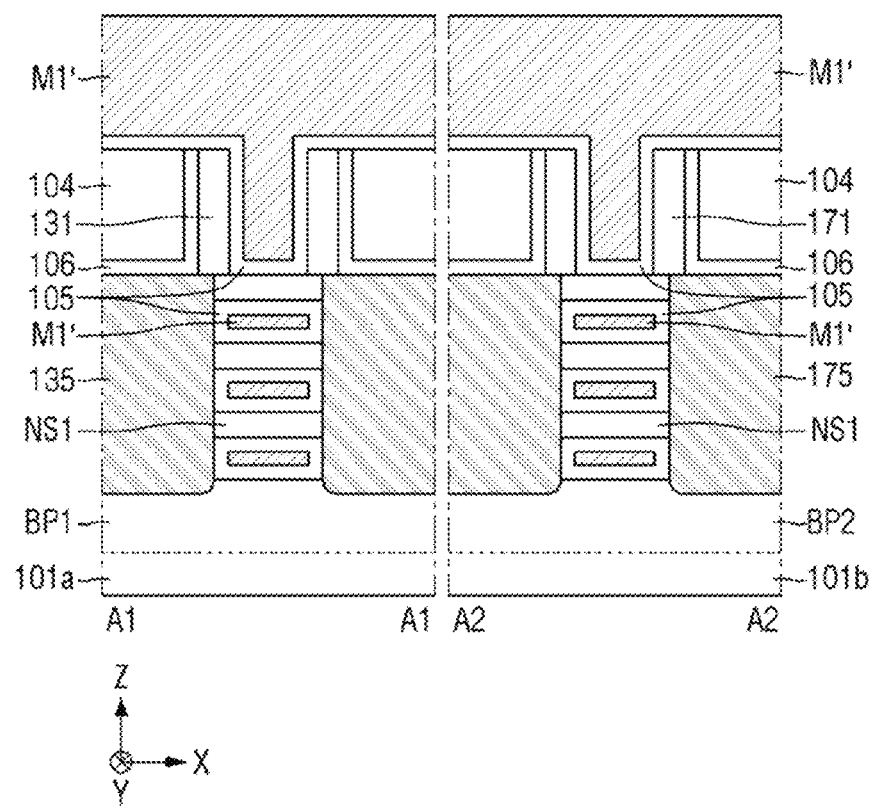

Referring to FIG. 28, a first upper metal material film M1' may be formed on the upper or exposed surfaces of the metal oxide film 105. After that, the process of the metal oxide film 105 may be performed as in the process of FIGS. 13 to 19. The description of the subsequent processes may be understood based on the description of the processes in FIGS. 13 to 19.

Figure 29:
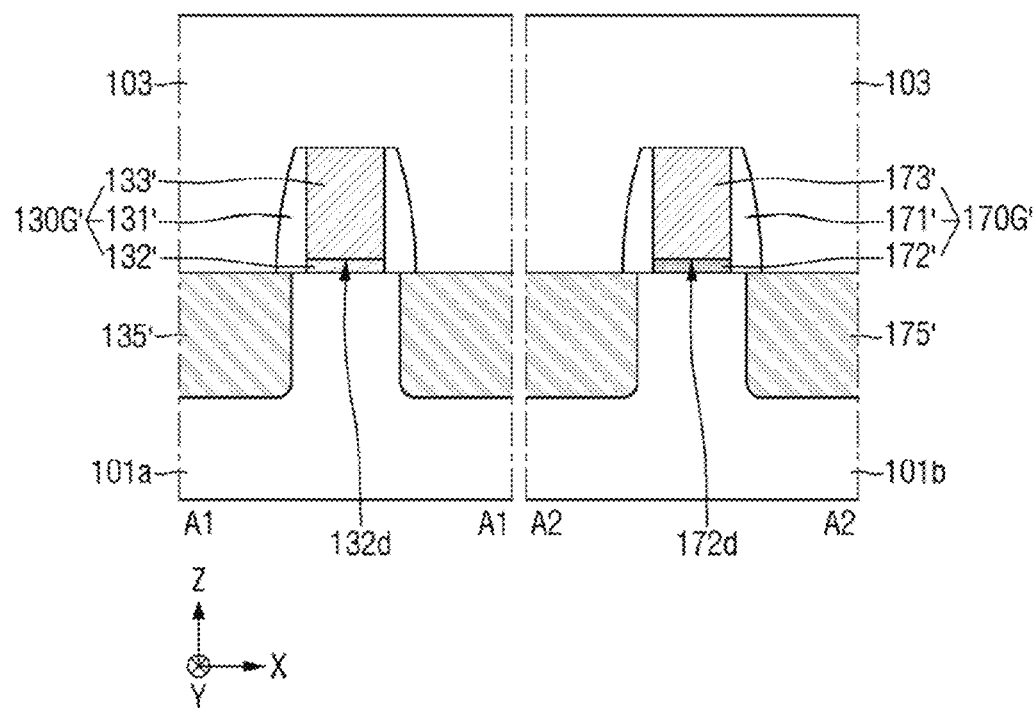
FIGS. 29 and 30 are diagrams of a semiconductor device according to some other embodiment.
Figure 30:
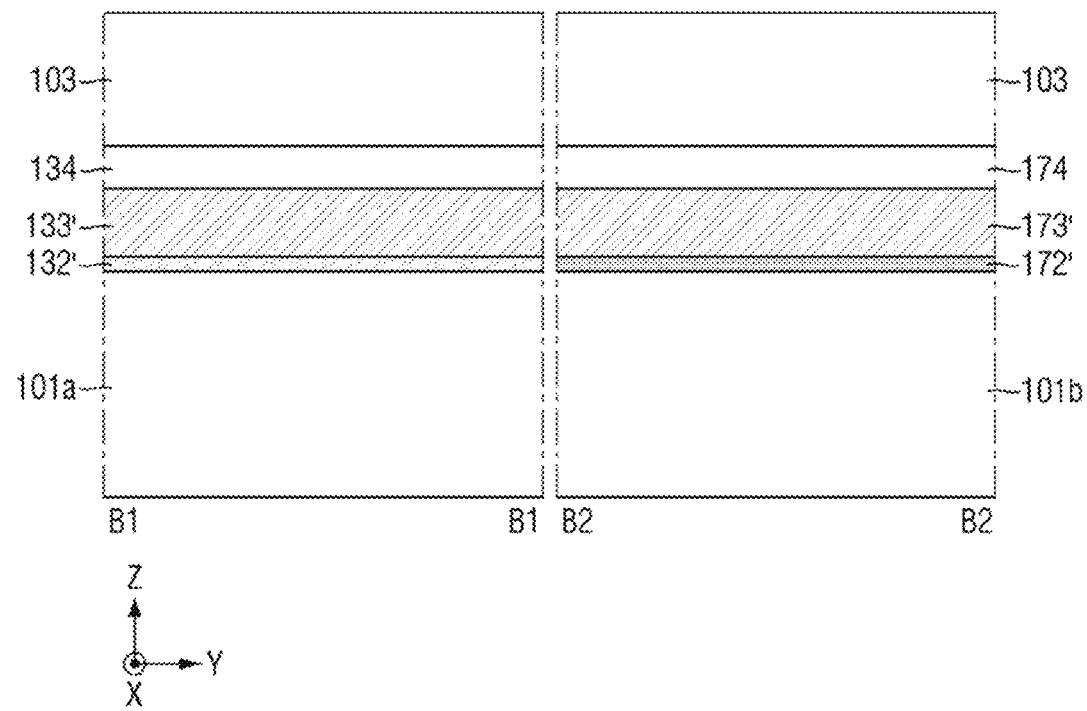

FIGS. 29 and 30 are diagrams of a semiconductor device according to some other embodiment. Hereinafter, the semiconductor device according to some other embodiments will be described referring to FIGS. 29 and 30. Differences from the semiconductor devices shown in FIGS. 3 to 4 may be mainly described.

The semiconductor device shown in FIGS. 29 and 30 may be implemented as a planar transistor. Therefore, the fin pattern and the field insulating film, which are separate active patterns, may not be formed in the semiconductor device shown in FIGS. 3 to 4, and a channel region may be formed on the plane of the substrates 101a and 101b that are in contact with the first and second gate structures 130G' and 170G'.

Therefore, instead of the first fin pattern F1 and the second fin pattern F2, the first and second gate structures 130G' and 170G' may be formed on the plane of the substrates 101a and 101b respectively corresponding to the first region 100a and the second region 100b.

Unlike the configuration in which the ferroelectric insulating film 132 and the paraelectric insulating film 172 of FIG. 3 extend along the upper surfaces of the substrates 101a and 101b and inner sides of the first and second gate spacers 131 and 171 in a "U" shape, the lower surfaces of the ferroelectric insulating film 132' and the paraelectric insulating film 172' may extend in a "—" shape that is in contact with the substrates 101a and 101b.

According to the placement of the ferroelectric insulating film 132' and the paraelectric insulating film 172', the side walls of the ferroelectric insulating film 132' and the side wall of the paraelectric insulating film 172' may respectively be in contact with the side walls of the first and second gate spacers 131 and 171.

FIGS. 31 to 40 are stages in a method of manufacturing the semiconductor device corresponding to FIGS. 29 and 30.

Figure 31:
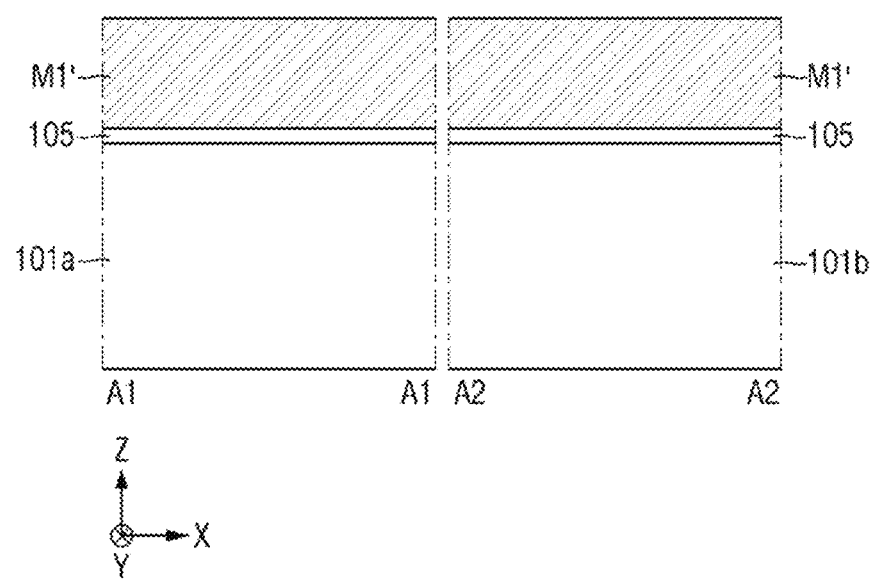
FIGS. 31 to 40 are stages in a method of manufacturing the semiconductor device of FIGS. 29 and 30.

Referring to FIG. 31, a metal oxide film 105 and a first upper metal material film M1' may be sequentially formed on the substrates 101a and 101b. The metal oxide film 105 corresponds to the metal oxide film 105 of FIGS. 3 to 4, and the first upper metal material film M1' corresponds to the first upper metal material film M1 of FIGS. 3 to 4.

Figure 32:
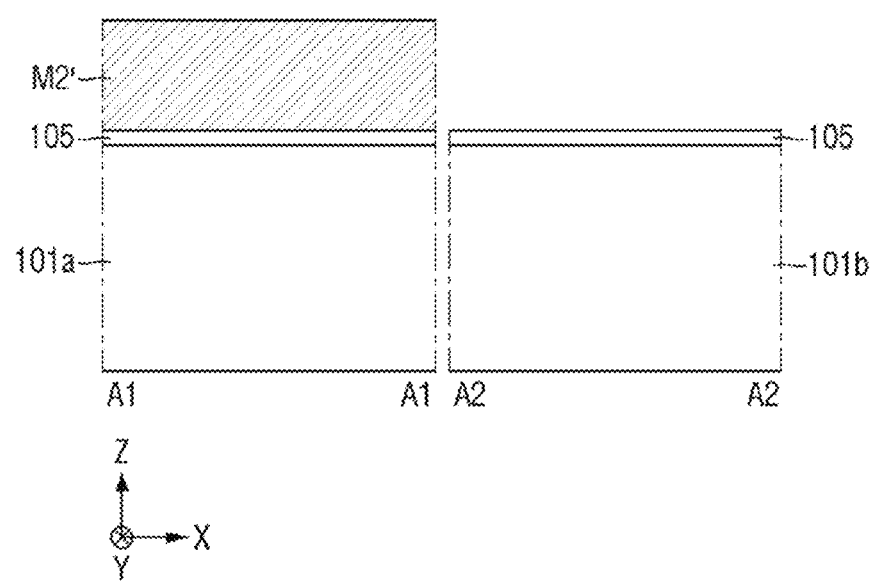

Referring to FIG. 32, by patterning the first upper metal material film M1', at least a part of the first upper metal material film M1' may be removed to form a second upper metal material film M2'. A portion of the metal oxide film 105 on the second region 100b may not be covered by or overlap with the second upper metal material film M2'.

Figure 33:
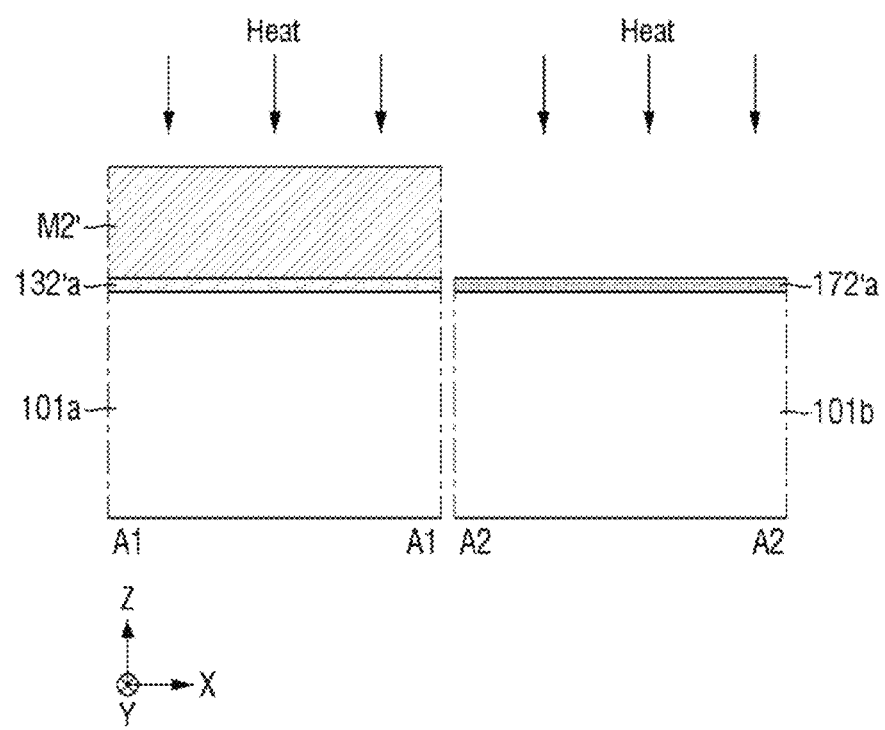
Figure 34:
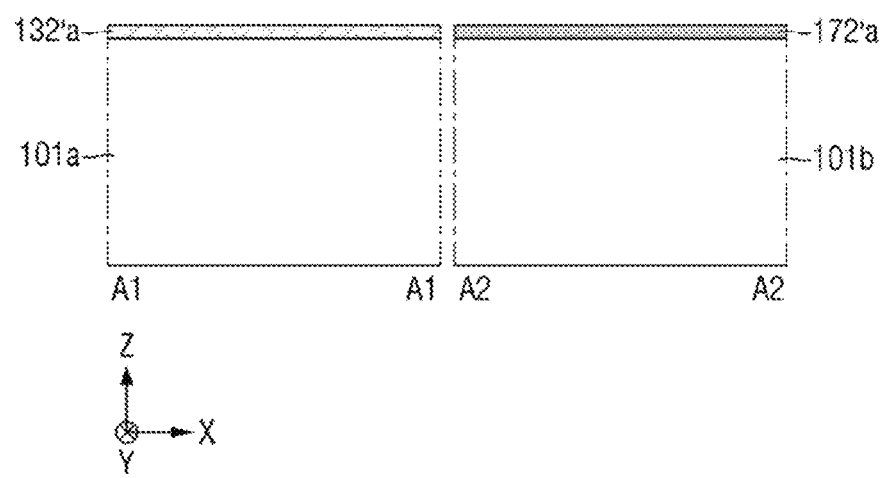

Referring to FIGS. 33 and 34, by simultaneously annealing the second upper metal material film M2' and the metal oxide film 105, a ferroelectric insulating layer 132'a may be formed between the second upper metal material film M2' and the substrate 101a, and a paraelectric insulating layer 172'a may be formed on the second region 100b of the substrate 101b.

At least a part of the metal oxide film 105 may be annealed while being in contact between the second upper metal material film M2' and the substrate 101a, and at least a part of the metal oxide film 105 may be annealed while a surface thereof is exposed, e.g., uncovered, by the second upper metal material film M2'. Remaining parts of the second upper metal material film M2' may then be removed.

Figure 35:
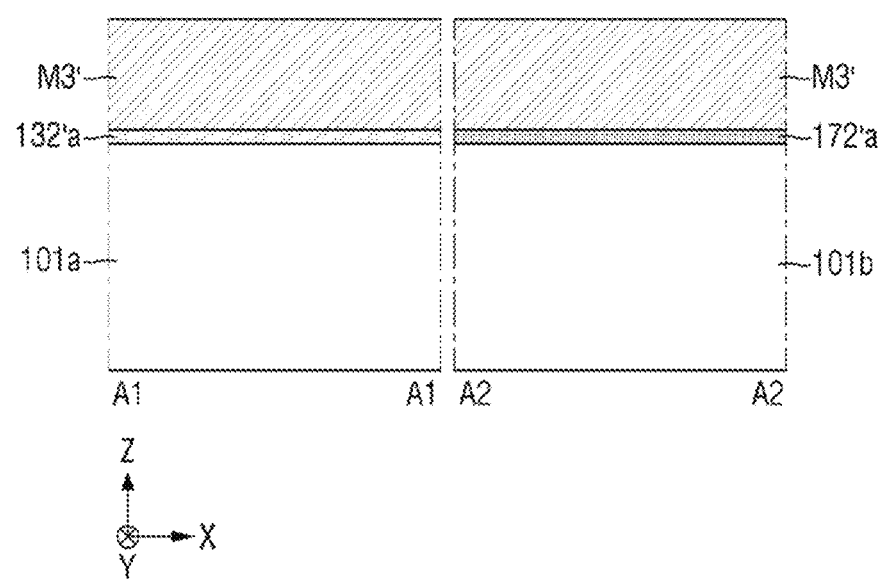
Figure 36:
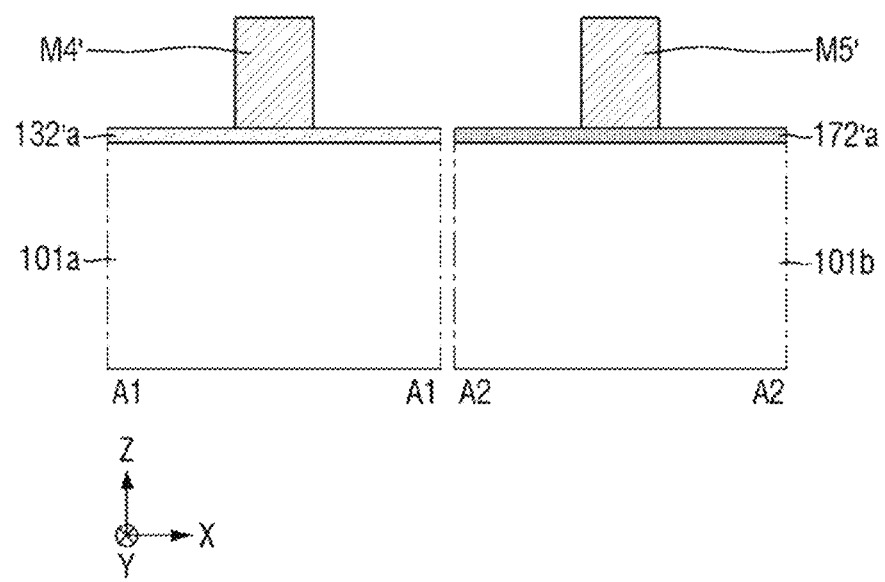

Referring to FIGS. 35 and 36, a third upper metal material film M3' may be formed on the ferroelectric insulating layer 132'a and the paraelectric insulating layer 172'a, and the third upper metal material film M3' may be patterned. Through the patterning operation, a fourth upper metal material film M4' (corresponding to the first gate electrode 133') may be formed on the ferroelectric insulating layer 132'a, and a fifth upper metal material film M5' (corresponding to the second gate electrode 173') may be formed on the paraelectric insulating layer 172'a.

Figure 37:
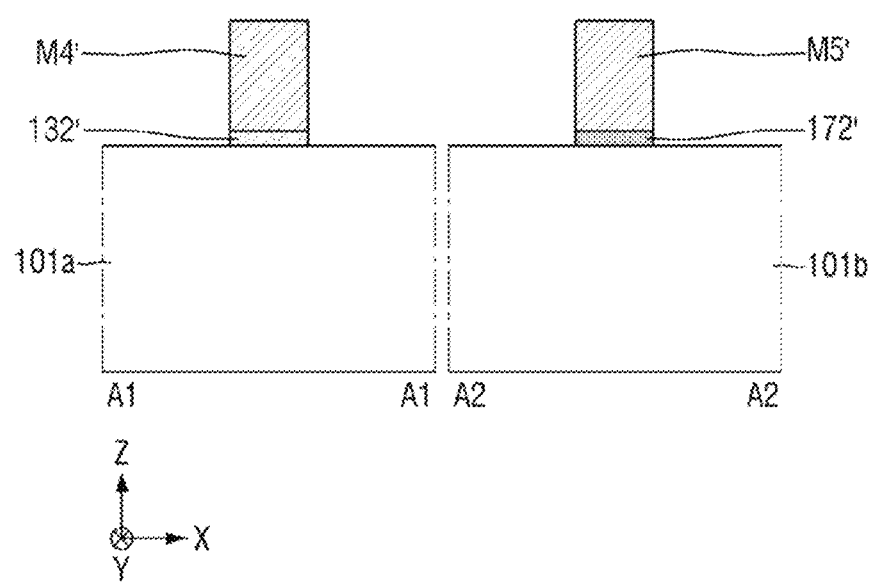

Referring to FIG. 37, the ferroelectric insulating layer 132'a and the paraelectric insulating layer 172'a may be etched using the fourth upper metal material film M4' and the fifth upper metal material film M5' as masks to form a ferroelectric insulating film 132' and a paraelectric insulating film 172'.

Figure 38:
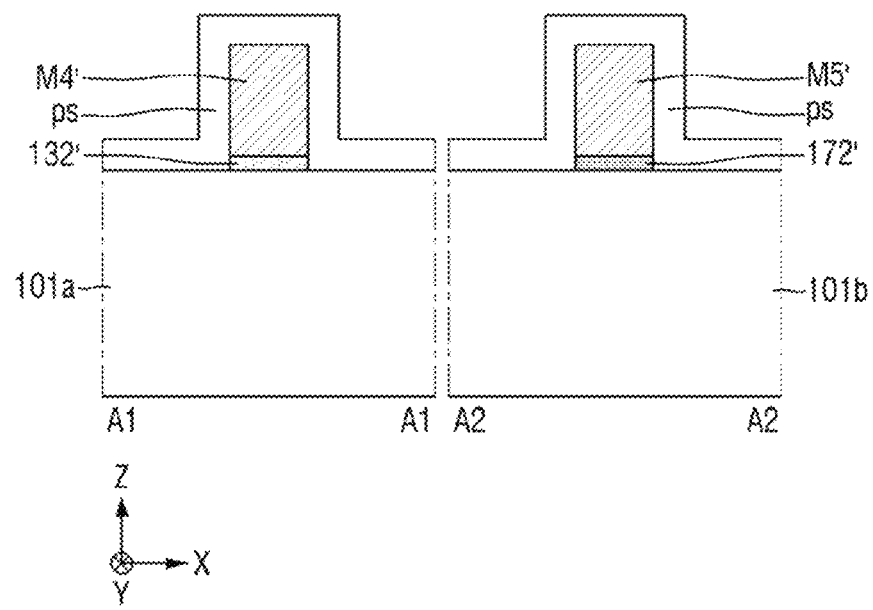

Referring to FIG. 38, a pre spacer (ps) may be deposited onto the substrates 101a and 101b, the fourth upper metal material film M4', and the fifth upper metal material film M5'. The pre spacer (ps) may include a same material as the first and second spacers 131 and 171 of FIGS. 3 and 4.

Figure 39:
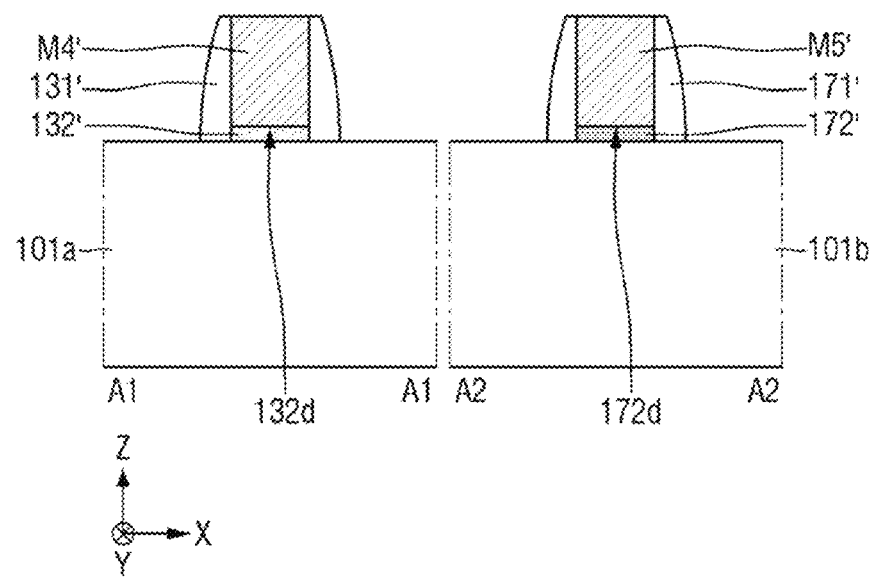

Referring to FIG. 39, the pre spacer (ps) may be etched to form the first and second spacers 131' and 171', thereby forming the first gate structure 130G' and the second gate structure 170G'.

Figure 40:
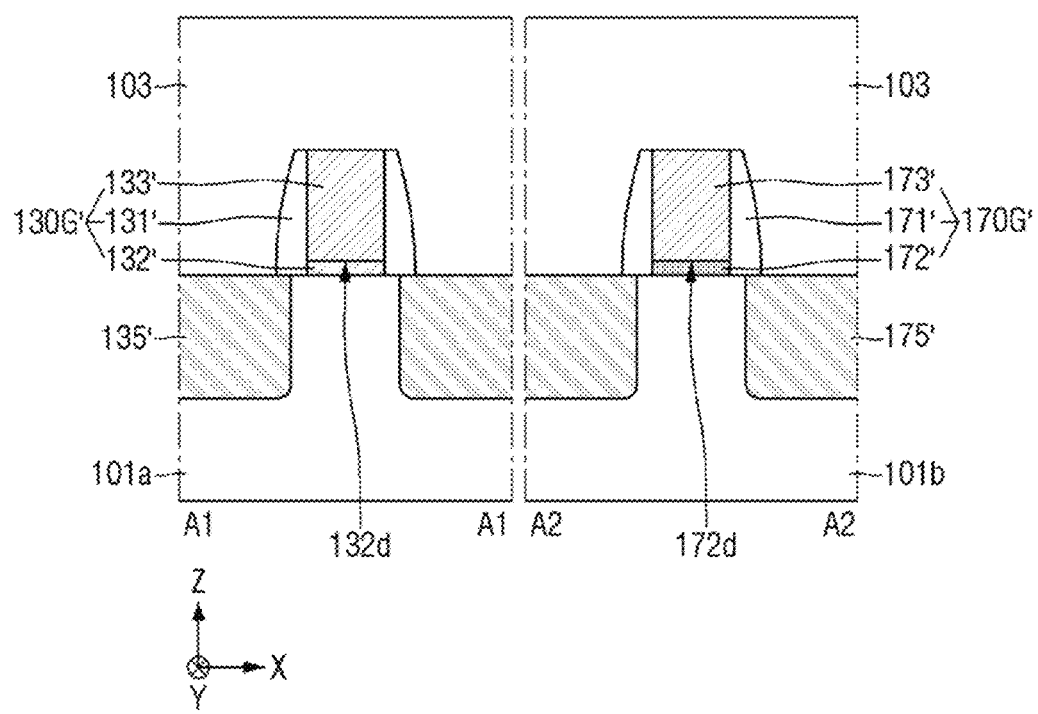

Referring to FIG. 40, a first source/drain pattern 135' and a second source/drain pattern 175' may be respectively formed on or at both sides of the first gate structure 130G' and the second gate structure 170G'. A second interlayer insulating film 103 may be formed on the first source/drain pattern 135' and the second source/drain pattern 175'. In an implementation, the second interlayer insulating film 103 may include, e.g., silicon oxide, silicon nitride, silicon oxynitride, or a low dielectric constant material, or may include the same material as the first interlayer insulating film 104.

In the method of manufacturing a semiconductor device according to an embodiment, after metal vapor deposition of a metal oxide film, post metal annealing and the post deposition annealing may be simultaneously performed to efficiently form different types of elements on the same die.

Figure 41:
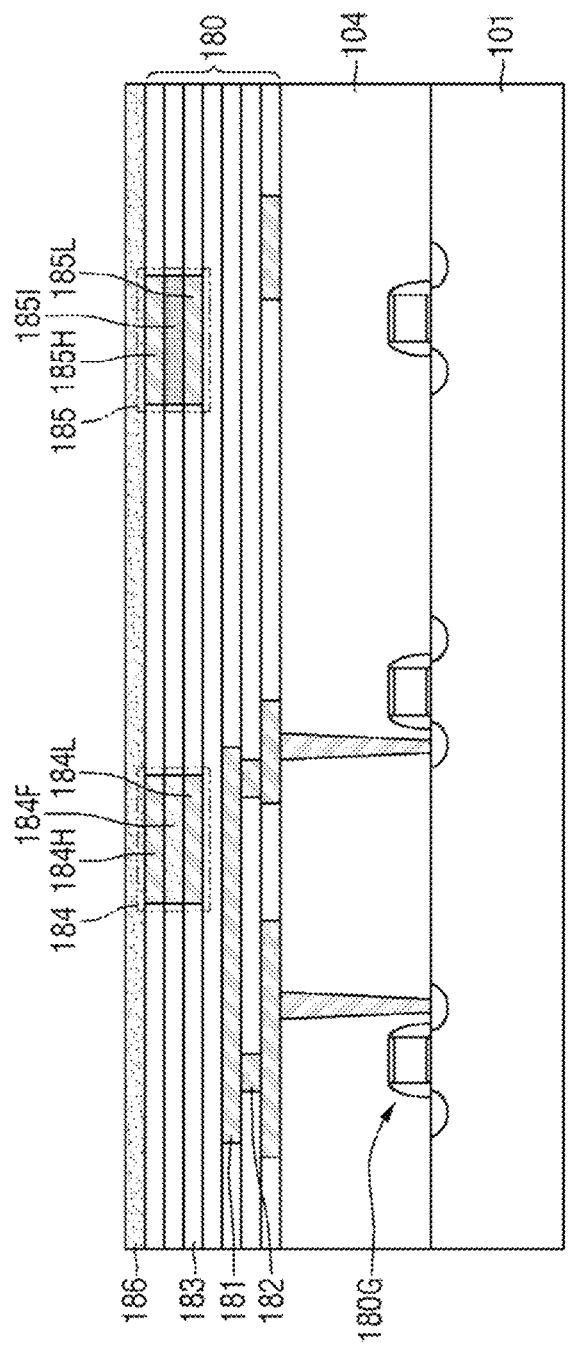
FIG. 41 is a diagram of a semiconductor device according to some other embodiments.

FIG. 41 is a semiconductor device according to some other embodiments.

Referring to FIG. 41, the semiconductor device according to some embodiments may include a gate structure 180G, an interlayer insulating film 104, and a redistribution structure 180 formed on the substrate 101.

The substrate 101 may correspond to the substrates 101a and 101b of FIGS. 3 and 4, and may be understood based on the description of the substrates 101a and 101b of FIGS. 3 and 4.

The gate structure 180G may be one of the first and second gate structures 130G and 170G of FIGS. 3 and 4, and the description of the gate structure 180G may be understood based on the description of the first and second gate structure 130G and 170G.

The interlayer insulating film 104 may be an insulating layer that covers the upper surfaces of the gate structure 180G and the substrate 101, corresponds to the first interlayer insulating film 104 of FIGS. 3 and 4, and the description of the interlayer insulating film 104 may be understood based on the description of the first interlayer insulating film 104 of FIGS. 3 and 4.

The redistribution structure 180 may include a conductive layer 181, a via 182, an insulating layer 183, a backend memory element 184, a backend capacitor 185, and a passivation layer 186.

The conductive layer 181 may be between the conductive layers 181, may be connected to a contact penetrating the interlayer insulating film 104, and may be electrically connected to the gate structure 180G. In an implementation, the conductive layer 181 may be connected to the backend memory element 184, the backend capacitor 185, or the like.

The via 182 may electrically connect conductive layers 181 at different heights from each other. The semiconductor devices according to some embodiments may transmit and receive electric signals input from the outside to and from the gate structure 180G through the conductive layer 181 and the via 182.

In an implementation, the conductive layer 181 and via 182 may include, e.g., copper (Cu).

The backend memory element 184 may include a first lower metal film 184L, a ferroelectric insulating film 184F, and a first upper metal film 184H.

The first lower metal film 184L, the ferroelectric insulating film 184F, and the first upper metal film 184H may overlap in a vertical direction, and the ferroelectric insulating film 184F may be between the first lower metal film 184L and the first upper metal film 184H, and may be in contact with them.

In an implementation, the first lower metal film 184L and the first upper metal film 184H may include, e.g., titanium (Ti), titanium nitride (TiN), tantalum (Ta), tantalum nitride (TaN), tungsten (W), tungsten nitride (WN), ruthenium (Ru), ruthenium oxide (RuOx), iridium (Ir), platinum (Pt), or molybdenum (M).

The ferroelectric insulating film 184F may include the same material as the ferroelectric insulating film 132 of FIGS. 3 and 4.

The backend capacitor 185 may include a second lower metal film 185L, a paraelectric insulating film 185I, and a second upper metal film 185H.

The second lower metal film 185L, the paraelectric insulating film 185I, and the second upper metal film 185H may overlap in a vertical direction, and the paraelectric insulating film 185I may be between the second lower metal film 185L and the second upper metal film 185H, and may be in contact with them.

The second lower metal film 185L and the second upper metal film 185H may include, e.g., titanium (Ti), titanium nitride (TiN), tantalum (Ta), tantalum nitride (TaN), tungsten (W), tungsten nitride (WN), ruthenium (Ru), ruthenium oxide (RuOx), iridium (Ir), platinum (Pt), or molybdenum (M).

The paraelectric insulating film 185I may include the same material as the paraelectric insulating film 172 of FIGS. 3 and 4.

In an implementation, a connection pad and an external connection terminal may be on or in a passivation layer 186, and a part of the passivation layer 186 may be exposed to the outside. The passivation layer 186 may include, e.g., an oxide film or a nitride film.

FIGS. 42 to 49 are stages in a method of manufacturing the semiconductor device of FIG. 41.

Figure 42:
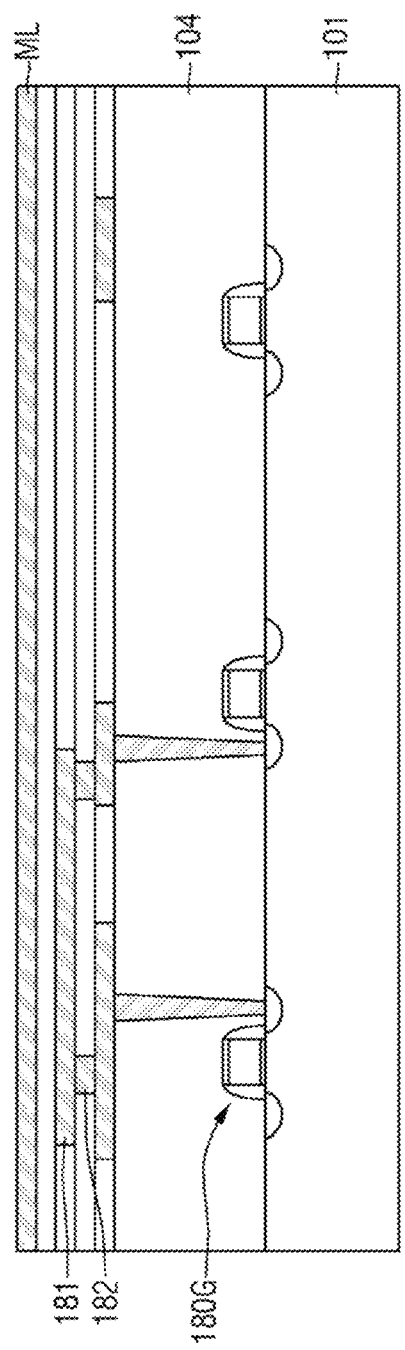
FIGS. 42 to 49 are stages in a method of manufacturing the semiconductor device of FIG. 41.
Figure 43:
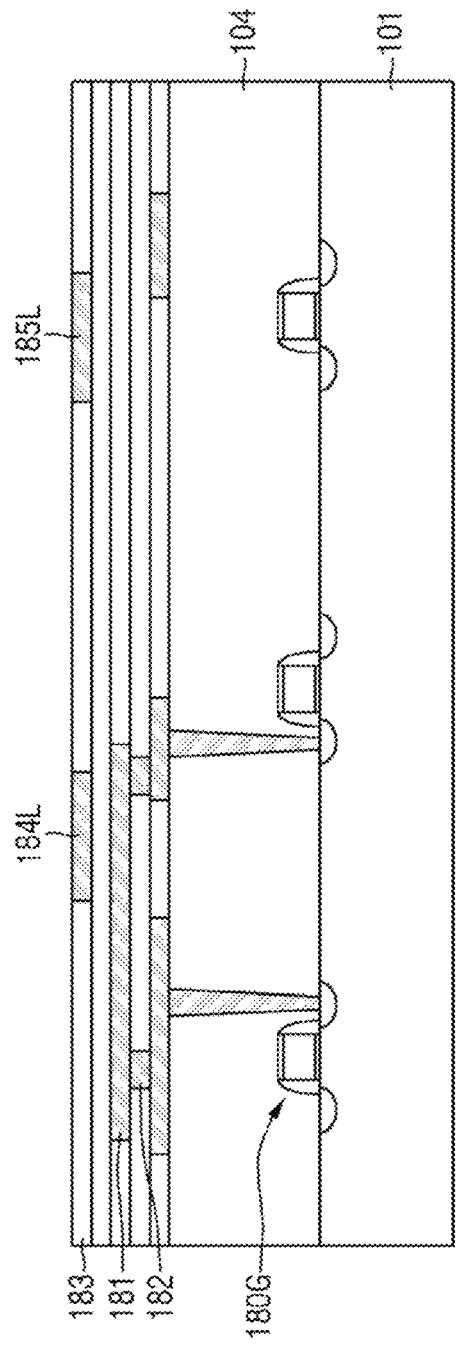

Referring to FIGS. 42 and 43, an interlayer insulating film 104 that covers the gate structure 180G on the substrate 101 may be formed, and a lower metal layer ML may be formed on the interlayer insulating film 104.

Subsequently, the lower metal layer ML may be patterned to form the first lower metal film 184L and the second lower metal film 185L.

Figure 44:
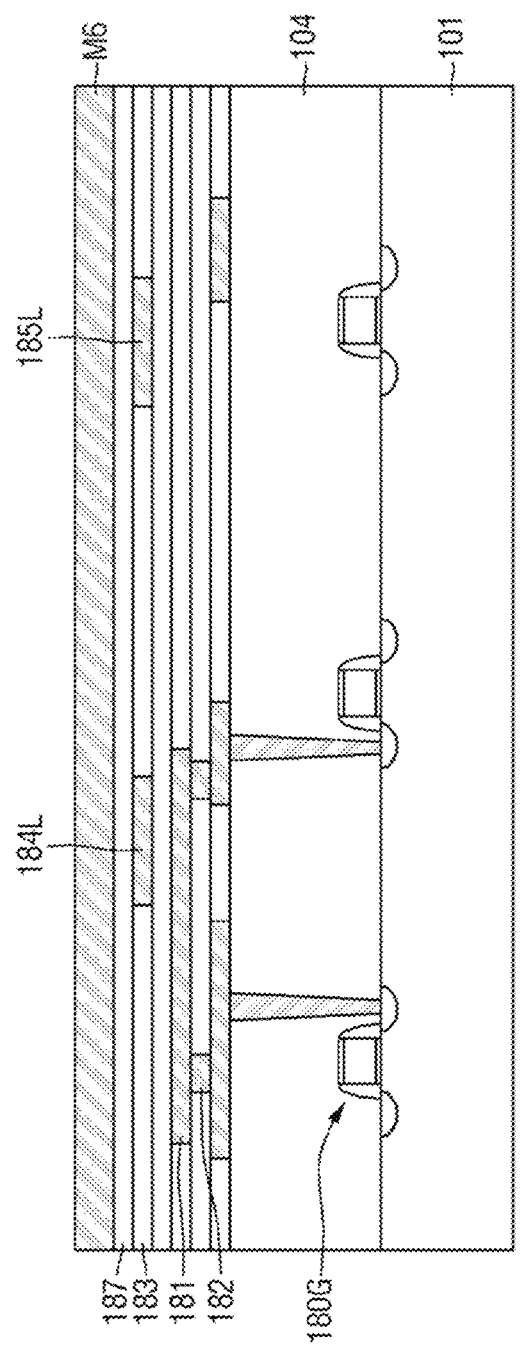

Referring to FIG. 44, a metal oxide film 187 and a sixth upper metal material film M6 may be sequentially formed on the first lower metal film 184L and the second lower metal film 185L.

The metal oxide film 187 may correspond to the metal oxide film 105 of FIGS. 3 to 40, and the sixth upper metal material film M6 may correspond to the first upper metal material film M1 of FIGS. 3 to 40.

Figure 45:
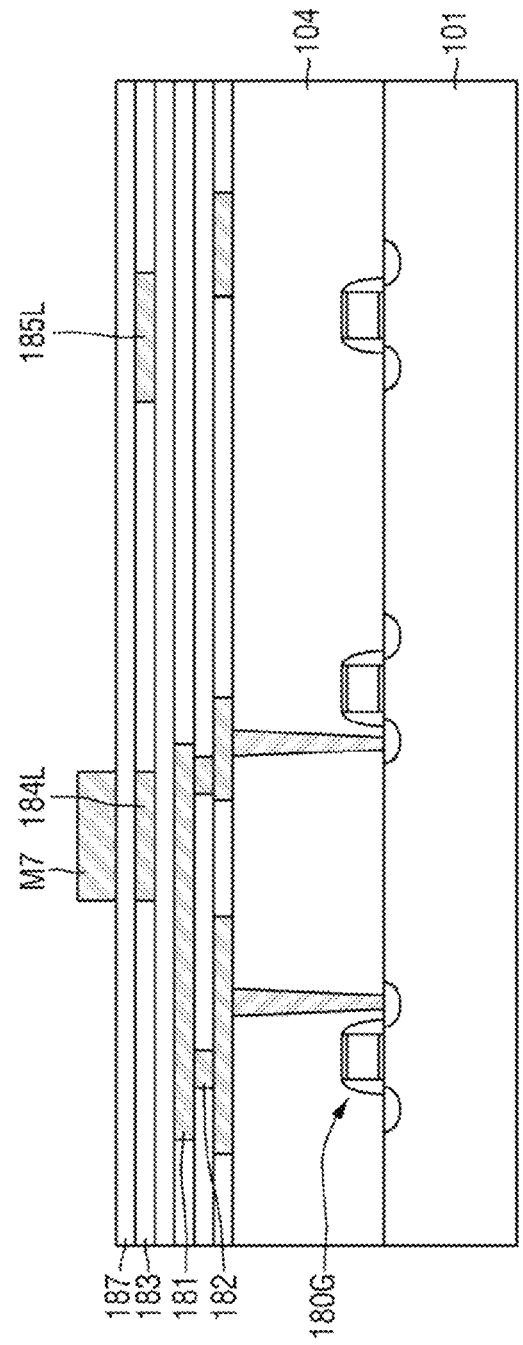

Referring to FIG. 45, by patterning the sixth upper metal material film M6, at least a part of the sixth upper metal material film M6 may be removed to form the seventh upper metal material film M7. In an implementation, the seventh upper metal material film M7 and the second lower metal film 185L may not overlap in a vertical direction.

Figure 46:
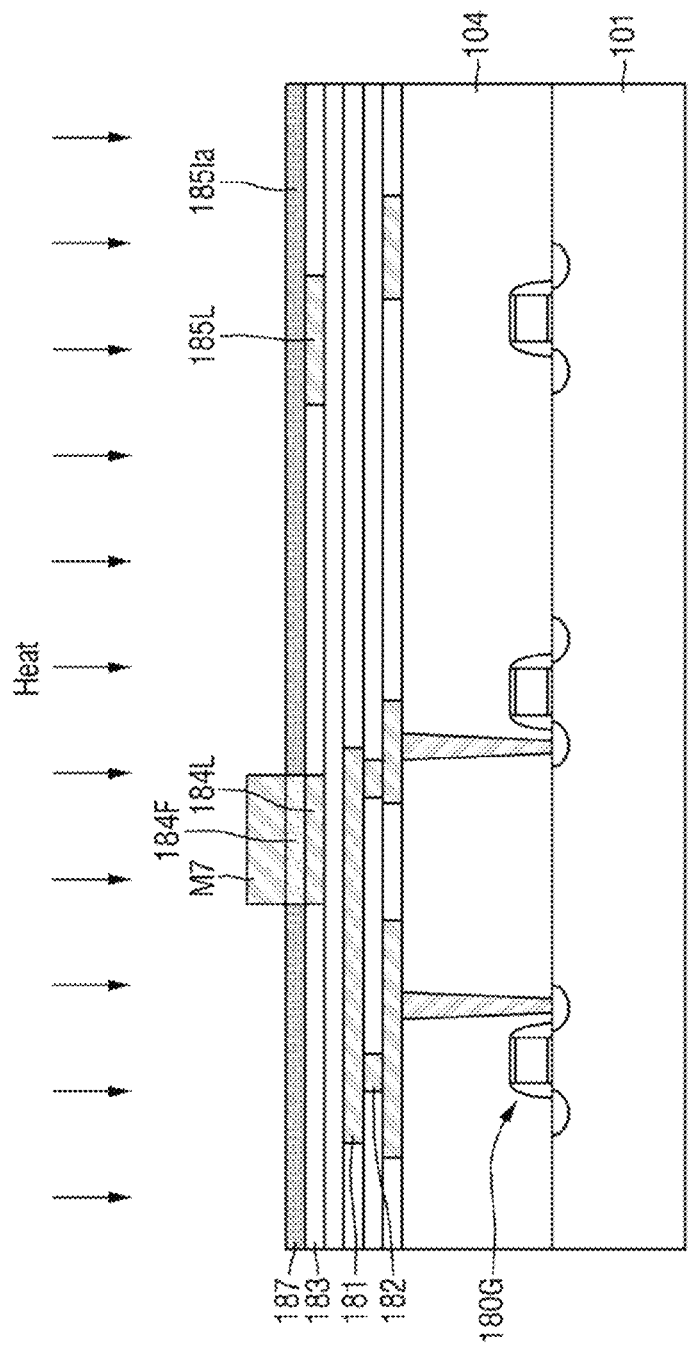

Referring to FIG. 46, the seventh upper metal material film M7 and the metal oxide film 187 may be simultaneously annealed, a ferroelectric insulating film 184F may be formed between the seventh upper metal material film M7 and the first lower metal film 184L, and a paraelectric insulating layer 184Ia may be formed on the second lower metal film 185L.

At least a part of the metal oxide film 187 may be annealed while being contact between the seventh upper metal material film M7 and the first lower metal film 184L, and at least another part of the metal oxide film 187 may be annealed with a surface exposed, e.g., uncovered, by the seventh upper metal material film M7. In an implementation, the seventh upper metal material film M7 may be removed.

Figure 47:
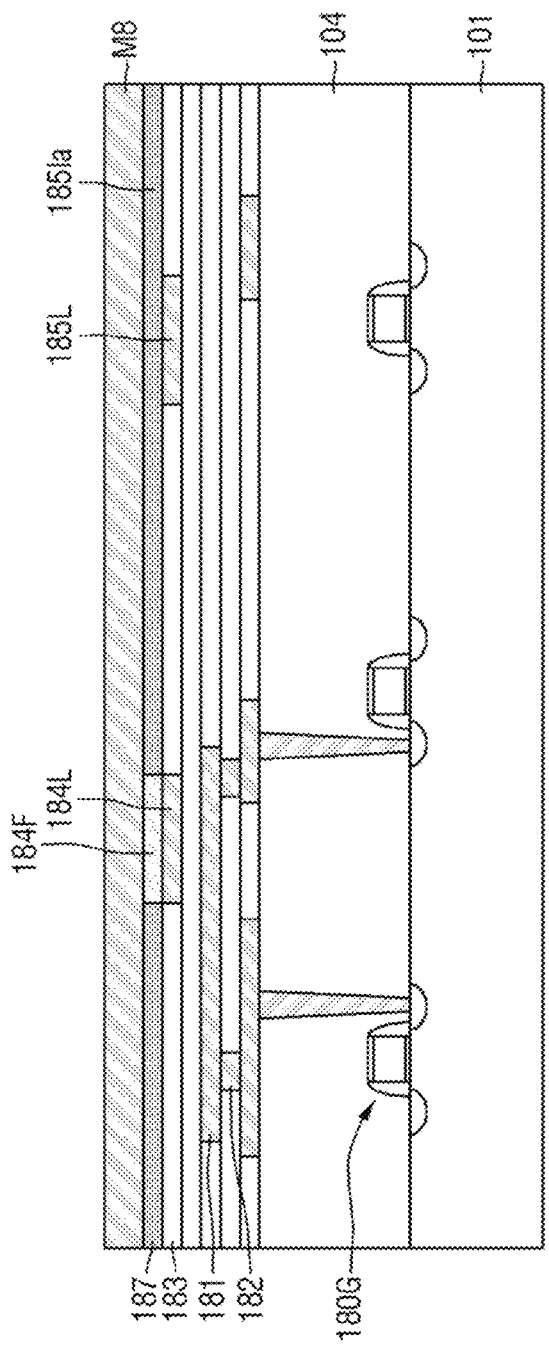
Figure 48:
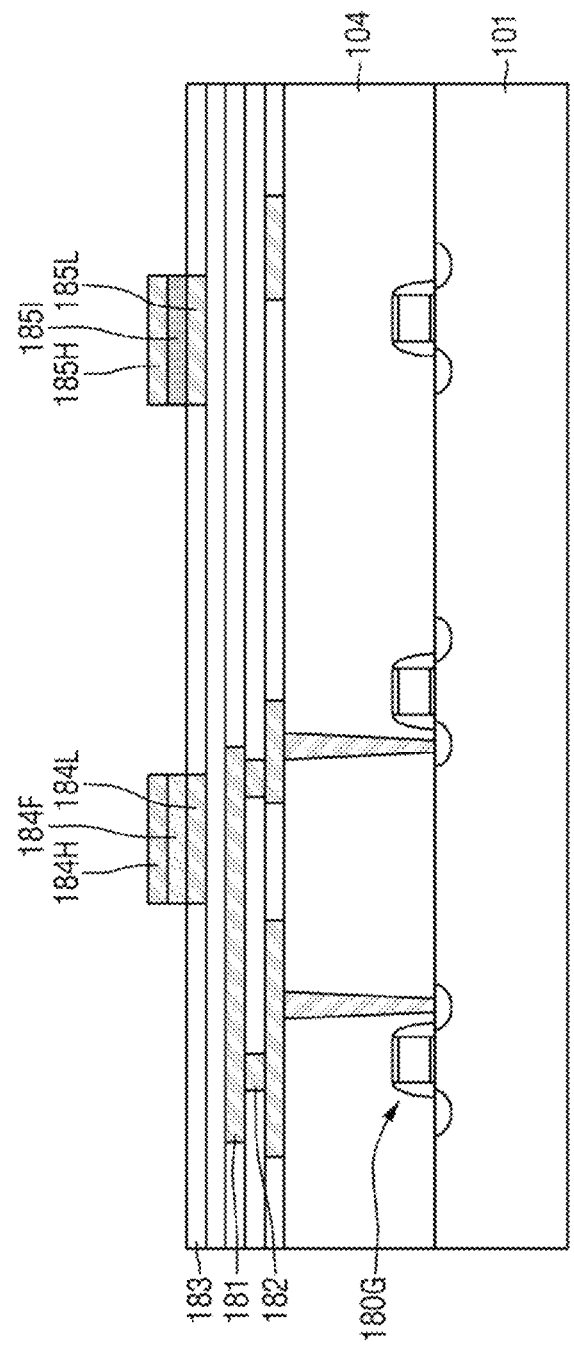

Referring to FIGS. 47 and 48, an eighth upper metal material film M8 may be formed on the paraelectric insulating layer 184Ia and the ferroelectric insulating film 184F, the eighth upper metal material film M8 may be patterned, and the paraelectric insulating layer 184Ia may also be patterned to form the backend memory element 184 and the backend capacitor 185.

Figure 49:
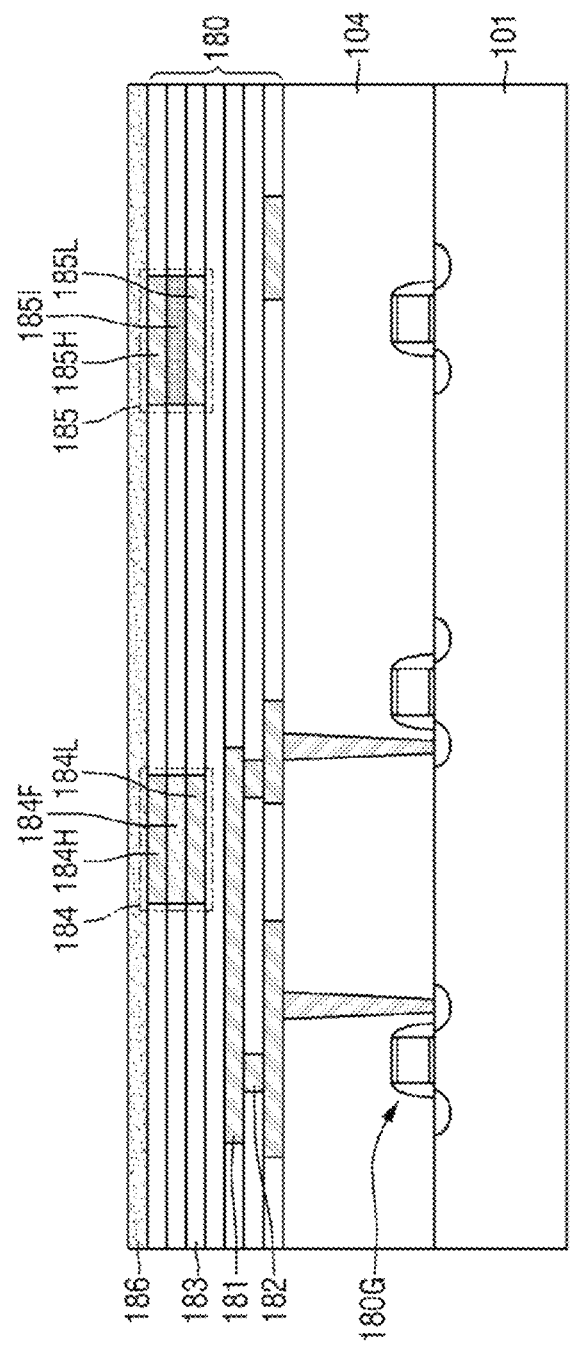

Referring to FIG. 49, an insulating layer 183 and a passivation layer 186 may be formed on the backend memory element 184 and the backend capacitor 185.

By way of summation and review, even if a processing speed of a processor increases, data transmission speed between the processor and the memory device may act as a bottleneck of performance improvement to limit throughput of the computing system. Accordingly, a memory-in-logic device in which processor logic includes a memory cell may be used, or dedicated processor logic may be used.

As a result, a memory-in-logic device in which data such as voice, images, videos, or text, which are target data of artificial intelligence, video/motion recognition, deep learning, and machine learning, may be processed in units of a DIE or chip may be used, or dedicated processor logic may be used.

In the method of manufacturing the semiconductor device according to an embodiment, after metal vapor deposition of a metal oxide film, post metal annealing and post deposition annealing may be simultaneously performed to efficiently form different types of elements on the same die.

One or more embodiments may provide a method of manufacturing a semiconductor device that efficiently manufactures a memory element and a logic element on a same die.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A method of manufacturing a semiconductor device, the method comprising:
   providing a substrate including a first region and a second region such that the second region is separated from the first region;
   forming a metal oxide film on the first region of the substrate and the second region of the substrate;
   forming an upper metal material film on the metal oxide film on the first region of the substrate such that the upper metal material film does not overlap the metal oxide film on the second region of the substrate and the metal oxide film of the second region is exposed; and
   simultaneously annealing the upper metal material film and the exposed metal oxide film to form a ferroelectric insulating film on the first region of the substrate and form a paraelectric insulating film on the second region of the substrate.

2. The method of manufacturing a semiconductor device as claimed in claim 1, wherein at least a part of the metal oxide film is in contact with an active pattern on the first region of the substrate and in contact with an active pattern on the second region of the substrate.

3. The method of manufacturing the semiconductor device as claimed in claim 2, wherein:
   the active pattern includes a fin pattern, and
   the metal oxide film is on an upper surface of the fin pattern.

4. The method of manufacturing the semiconductor device as claimed in claim 2, wherein:
   the active pattern includes a lower pattern and a sheet pattern separated from the lower pattern in a first direction, and
   forming the metal oxide film includes wrapping the metal oxide film around the sheet pattern.

5. The method of manufacturing the semiconductor device as claimed in claim 1, further comprising forming a lower metal film on the first region of the substrate prior to forming the metal oxide film, wherein:
   a portion of the metal oxide film overlaps the lower metal film below the metal oxide film on the first region of the substrate in a vertical direction, and
   the metal oxide film is between the lower metal film and the upper metal material film on the first region.

6. The method of manufacturing the semiconductor device as claimed in claim 1, wherein a thickness of the ferroelectric insulating film in a vertical direction is the same as a thickness of the paraelectric insulating film in the vertical direction.

7. The method of manufacturing the semiconductor device as claimed in claim 6, wherein the thicknesses of the ferroelectric insulating film and the paraelectric insulating film in the vertical direction are each within a range of 1.5 nm to 20 nm.

8. The method of manufacturing the semiconductor device as claimed in claim 1, wherein the annealing is performed within a temperature range of 300° C. to 1,100° C.

9. The method of manufacturing the semiconductor device as claimed in claim 1, wherein the metal oxide film includes hafnium oxide or zirconium oxide.

10. The method of manufacturing the semiconductor device as claimed in claim 1, wherein forming the upper metal material film such that the upper metal material film does not overlap the metal oxide film on the second region of the substrate includes patterning the upper metal material film to remove a portion of the upper metal material film that overlaps the metal oxide film on the second region of the substrate.

11. A method of manufacturing a semiconductor device, the method comprising:
   forming a first dummy gate on a substrate such that the first dummy gate includes first spacers extending in a first direction and a first dummy electrode between the first spacers;
   forming a second dummy gate on the substrate such that the second dummy gate includes second spacers extending in the first direction and different from the first spacers and a second dummy electrode between the second spacers;
   removing the first dummy electrode and the second dummy electrode to form a first trench between the first spacers and a second trench between the second spacers;
   forming a metal oxide film along an upper surface of the substrate and at least a part of side walls of the first spacers and the second spacers;
   forming an upper metal material on the metal oxide film such that the upper metal material does not overlap the second spacers and the second trench in a vertical direction; and
   simultaneously annealing the upper metal material and the metal oxide film to form a ferroelectric insulating film along at least a part of the side wall of the first spacers, and to form a paraelectric insulating film along at least a part of the side wall of the second spacers.

12. The method of manufacturing the semiconductor device as claimed in claim 11, wherein:
   the metal oxide film extends along the first trench defined by the first spacers, and
   the metal oxide film in the first trench is in contact with the upper metal material.

13. The method of manufacturing the semiconductor device as claimed in claim 12, wherein the metal oxide film is annealed while in contact with the upper metal material.

14. The method of manufacturing the semiconductor device as claimed in claim 11, wherein a thickness of the ferroelectric insulating film in the vertical direction is the same as a thickness of the paraelectric insulating film in the vertical direction.

15. The method of manufacturing the semiconductor device as claimed in claim 11, wherein:
   the annealing is performed within a temperature range of 300° C. to 1,100° C., and the annealing includes rapid thermal annealing, laser annealing, or flash annealing.

16. The method of manufacturing the semiconductor device as claimed in claim 11, wherein:
   the metal oxide film includes hafnium oxide or zirconium oxide, and
   the metal oxide film is doped with aluminum (Al), titanium (Ti), niobium (Nb), lanthanum (La), yttrium (Y), magnesium (Mg), silicon (Si), calcium (Ca), cerium (Ce), dysprosium (Dy), erbium (Er), gadolinium (Gd), germanium (Ge), scandium (Sc), strontium (Sr), or tin (Sn).

17. A method of manufacturing a semiconductor device, the method comprising:
   providing a substrate;
   forming a gate electrode on the substrate;
   forming an interlayer insulating film that covers the gate electrode on the substrate;
   forming a first lower metal film and a second lower metal film on the interlayer insulating film such that the second lower metal film is separated from the first lower metal film;
   forming a metal oxide film on the first lower metal film, the second lower metal film, and the interlayer insulating film;
   forming an upper metal material film on the metal oxide film such that the upper metal material film does not overlap a portion of the metal oxide film on the second lower metal film; and
   simultaneously annealing the upper metal material film and the metal oxide film to form a ferroelectric insulating film overlapping the first lower metal film in a vertical direction, and to form a paraelectric insulating film overlapping the second lower metal film in the vertical direction.

18. The method of manufacturing the semiconductor device as claimed in claim 17, wherein:
   at least a part of the metal oxide film is annealed while in contact with the first lower metal film and the upper metal material film, and
   the annealing includes rapid thermal annealing, laser annealing, or flash annealing.

19. The method of manufacturing the semiconductor device as claimed in claim 17, wherein forming an upper metal material film such that the upper metal material film does not overlap the portion of the metal oxide film on the second lower metal film includes patterning the upper metal material film to remove a portion of the upper metal material film that overlaps the metal oxide film on the second lower metal film in the vertical direction.

20. The method of manufacturing the semiconductor device as claimed in claim 17, wherein:
   the metal oxide film includes hafnium oxide or zirconium oxide, and
   the metal oxide film is doped with aluminum (Al), titanium (Ti), niobium (Nb), lanthanum (La), yttrium (Y), magnesium (Mg), silicon (Si), calcium (Ca), cerium (Ce), dysprosium (Dy), erbium (Er), gadolinium (Gd), germanium (Ge), scandium (Sc), strontium (Sr), or tin (Sn).

* * * * *